(12) United States Patent
Kim et al.

(10) Patent No.: US 11,793,043 B2
(45) Date of Patent: Oct. 17, 2023

(54) DISPLAY APPARATUS HAVING A METAL PATTERN LAYER DISPOSED BETWEEN A SUBSTRATE AND A PIXEL

(71) Applicant: Samsung Display Co., Ltd., Yongin-Si (KR)

(72) Inventors: Sunghwan Kim, Yongin-si (KR); Wonkyu Kwak, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 120 days.

(21) Appl. No.: 17/201,053

(22) Filed: Mar. 15, 2021

(65) Prior Publication Data

US 2021/0376044 A1    Dec. 2, 2021

(30) Foreign Application Priority Data

May 28, 2020   (KR) .......................... 10-2020-0064612

(51) Int. Cl.
*H01L 29/08* (2006.01)
*H10K 59/131* (2023.01)
*H10K 59/65* (2023.01)
*H10K 59/124* (2023.01)
*H10K 59/121* (2023.01)

(52) U.S. Cl.
CPC ......... *H10K 59/131* (2023.02); *H10K 59/124* (2023.02); *H10K 59/1213* (2023.02); *H10K 59/1216* (2023.02); *H10K 59/65* (2023.02)

(58) Field of Classification Search
CPC ............. H01L 27/3276; H01L 27/3234; H01L 27/3258; H01L 27/3262; H01L 27/3265

USPC ........................................................... 257/40
See application file for complete search history.

(56) References Cited

U.S. PATENT DOCUMENTS

| 8,816,331 B2 | 8/2014 | Choi et al. |
| 10,199,446 B2 | 2/2019 | Kim et al. |
| 2014/0145156 A1* | 5/2014 | Choi ....................... H01L 51/56 438/34 |
| 2016/0111482 A1* | 4/2016 | Cho .................... H01L 27/1248 257/40 |
| 2016/0260904 A1 | 9/2016 | Park et al. |
| 2017/0178566 A1* | 6/2017 | Xu ....................... H01L 51/5215 |

(Continued)

FOREIGN PATENT DOCUMENTS

| EP | 3343627 A1 * | 7/2018 | ......... H01L 27/3209 |
| JP | 2009-187748 A | 8/2009 | |
| KR | 10-2012-0124224 A | 11/2012 | |

(Continued)

*Primary Examiner* — Phuc T Dang
(74) *Attorney, Agent, or Firm* — Innovation Counsel LLP

(57) ABSTRACT

A display apparatus in which a display area is expanded so that an image may be displayed even in an area where components are arranged\is provided. The display apparatus includes a substrate including a first area in which a transmissive portion is located and a second area adjacent to the first area, a pixel circuit unit arranged in the first area and including a pixel circuit, a first pixel electrode arranged in the first area and electrically connected to the pixel circuit, the first pixel electrode having a first portion overlapping the pixel circuit unit and a second portion not overlapping the pixel circuit unit, and a metal pattern layer arranged between the substrate and the first pixel electrode and corresponding to the second portion.

15 Claims, 16 Drawing Sheets

(56) References Cited

U.S. PATENT DOCUMENTS

2020/0098843 A1* 3/2020 Jeon .................... H01L 27/3258
2020/0212137 A1* 7/2020 Wang ................... G09G 3/3266

FOREIGN PATENT DOCUMENTS

| KR | 10-2016-0106792 A | 9/2016 | | |
| KR | 10-2018-0013577 A | 2/2018 | | |
| WO | WO-2007072986 A1 * | 6/2007 | ........... | G01N 21/553 |

* cited by examiner

DISPLAY APPARATUS HAVING A METAL PATTERN LAYER DISPOSED BETWEEN A SUBSTRATE AND A PIXEL

CROSS-REFERENCE TO RELATED APPLICATION

This application is based on and claims priority under 35 U.S.C. § 119 to Korean Patent Application No. 10-2020-0064612, filed on May 28, 2020, in the Korean Intellectual Property Office, the disclosure of which is incorporated by reference herein in its entirety.

BACKGROUND

1. Field

One or more embodiments relate to a display apparatus, and more particularly, to a display apparatus in which a display area is expanded so that an image may be displayed even in an area where components are arranged.

2. Description of Related Art

Recently, the use of display apparatuses has increased. Furthermore, the structure of the display apparatuses has been diversified due to the increase of the complexity of display apparatuses. In addition, because display apparatuses have become thinner and lighter, the demand for display apparatuses has been dramatically expanded.

As display apparatuses are used in various ways, there may be various methods for designing the shape of a display apparatus, and functions combined with or linked to display apparatuses are increasing. Thus, there is need to develop a novel display device that has different functions inside of a display area so that the display area can display images as well as taking pictures using a camera or taking different sensing data using various sensors.

SUMMARY

In an effort to increase functions combined with or linked to display apparatuses, one or more embodiments provide a display apparatus having a first area in which components such as sensors or cameras may be arranged inside a display area. However, these problems are examples, and the scope of the embodiments is not limited thereby.

Additional aspects will be set forth in part in the description which follows and, in part, will be apparent from the description, or may be learned by practice of the presented embodiments of the disclosure.

According to one or more embodiments, a display apparatus includes a substrate including a first area in which a transmissive portion is located and a second area adjacent to the first area, a pixel circuit unit arranged in the first area and including a pixel circuit, a first pixel electrode arranged in the first area and electrically connected to the pixel circuit, the first pixel electrode having a first portion overlapping the pixel circuit unit and a second portion not overlapping the pixel circuit unit, and a metal pattern layer arranged between the substrate and the first pixel electrode and corresponding to the second portion.

A constant voltage may be applied to the metal pattern layer.

A voltage may not be applied to the metal pattern layer.

The metal pattern layer may include a plurality of slit patterns along a first direction.

The pixel circuit may include a thin-film transistor and a storage capacitor, the thin-film transistor may include a semiconductor layer, a gate electrode at least partially overlapping the semiconductor layer, and an electrode layer connected to the semiconductor layer, the storage capacitor may include a first electrode, which is a portion of the gate electrode, and a second electrode overlapping the first electrode, and the metal pattern layer may include the same material as at least one of the gate electrode, the electrode layer, and the second electrode.

The metal pattern layer may include a first metal layer including the same material as the electrode layer.

The display apparatus may further include a contact metal layer between the electrode layer and the first pixel electrode, wherein the metal pattern layer is arranged on the first metal layer and overlaps the first metal layer, and further includes a second metal layer including the same material as the contact metal layer.

The first metal layer may include a plurality of first slit patterns, and the second metal layer may include a plurality of second slit patterns.

The display apparatus may further include a second pixel electrode arranged adjacent to the first pixel electrode on the first area, wherein the second pixel electrode completely overlaps the pixel circuit unit.

The display apparatus may further include a third pixel electrode on the second area, a third emission layer on the third pixel electrode, and a first emission layer on the first pixel electrode, wherein the first emission layer and the third emission layer emit the same color of light, and an area of the first pixel electrode is greater than an area of the third pixel electrode.

The display apparatus may further include an organic insulating layer covering the pixel circuit unit, wherein the first pixel electrode is located on an upper surface of the organic insulating layer, wherein the upper surface of the organic insulating layer on which the first portion and the second portion of the first pixel electrode are located is planarized.

The organic insulating layer may have an opening corresponding to the transmissive portion.

A resolution of the first area may be lower than a resolution of the second area.

The display apparatus may further include a component arranged on one side of the substrate and corresponding to the first area.

The component may include an imaging device.

According to one or more embodiments, in a display apparatus including a first area and a second area adjacent to the first area, wherein a plurality of transmissive portions and a plurality of pixel groups are located in the first area, each of the plurality of pixel groups includes a pixel circuit unit including a plurality of pixel circuits, a plurality of first pixel electrodes partially overlapping the pixel circuit unit and a plurality of second pixel electrodes completely overlapping the pixel circuit unit, wherein the first pixel electrodes and the second pixel electrodes are each electrically connected to the plurality of pixel circuits, and a plurality of step compensation layers arranged adjacent to the pixel circuit unit and partially overlapping the plurality of first pixel electrodes.

Each of the plurality of step compensation layers may be arranged between one of the plurality of transmissive portions and the pixel circuit units.

The plurality of pixel groups may be electrically connected to one other by a first line and a second line which extend in a first direction and a second direction, respectively.

The display apparatus may further include a plurality of third pixel electrodes in the second area, wherein a first pixel including the first pixel electrodes and a third pixel including the third pixel electrodes emit the same color of light, and an area of the first pixel electrodes is greater than an area of the third pixel electrodes.

The plurality of first pixel electrodes may include a pixel electrode for emitting red, a pixel electrode for emitting green, and a pixel electrode for emitting blue.

Other aspects, features, and advantages other than those described above will become apparent from the following detailed description, claims and drawings for carrying out the embodiments.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
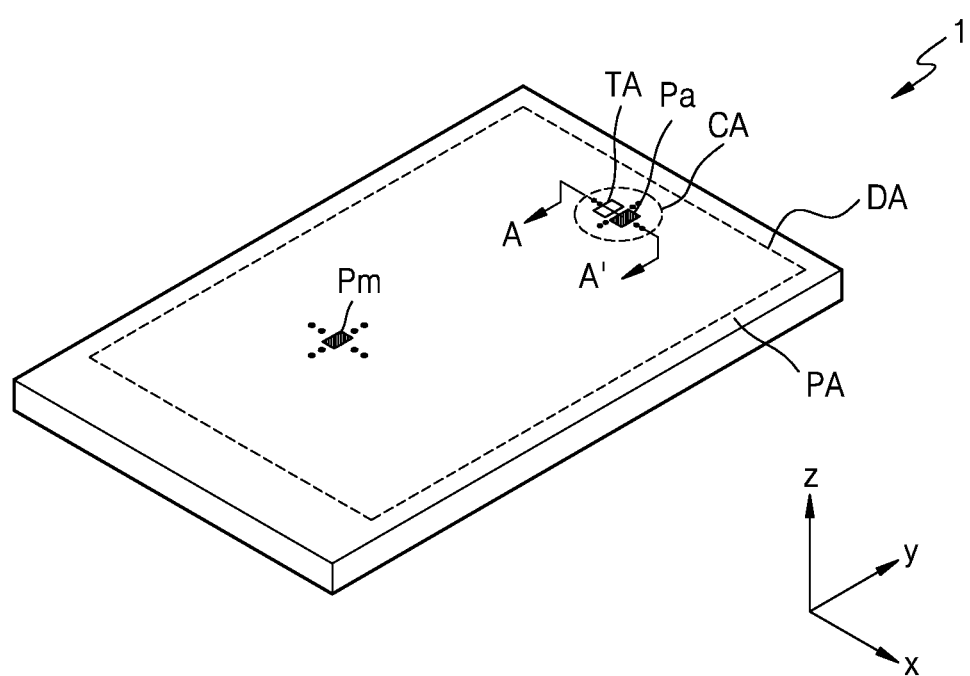
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the present disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

In this specification, the terms "first," "second," or the like are used for the purpose of distinguishing one component from other components, not limited meanings.

In this specification, a singular expression includes a plural expression unless the context clearly indicates otherwise.

Terms such as "include" or "have" in the present specification mean that a feature or component described in the specification exists, and does not exclude the possibility of adding one or more other features or components in advance.

In the present disclosure, when a part of a film, area, component, or the like is referred to as being on or above another part, it includes not only when it is directly above the other part, but also when another film, area, component, etc. is located therebetween.

In the present specification, when a membrane, area, component, or the like is connected, membranes, areas, or components may be directly connected, and/or other membranes, areas, and components may be indirectly connected with other membranes, areas, components therebetween. For example, throughout the present specification, when a membrane, an area, a component, etc. are electrically connected, the membrane, the area, the component, etc. are directly electrically connected, or the membrane, the area, the component, etc. have another membrane, area, component, etc. located therebetween and electrically connected indirectly.

In this specification, "A and/or B" represents A, B, or A and B. In addition, "at least one of A and B" represents A, B, or A and B.

The x-axis, y-axis, and z-axis are not limited to three axes on the Cartesian coordinate system, and may be interpreted in a broad sense including them. For example, the x-axis, the y-axis, and the z-axis may be perpendicular to one another, or may represent different directions that are not perpendicular to one another.

In the specification, when an embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. In other words, because sizes and thicknesses of components in the drawings are arbitrarily illustrated for convenience of explanation, the following embodiments are not limited thereto.

FIG. 1 is a perspective view of a display apparatus 1 according to an embodiment.

Referring to FIG. 1, the display apparatus 1 includes a first area CA (hereinafter, the component area), and a second area DA for realizing an image (hereinafter, the display area). The display apparatus 1 may provide a main image by using light emitted from a plurality of main pixels Pm arranged in the display area DA.

At least a portion of the first area CA may be surrounded by the display area DA. The first area CA may be a component area in which components such as a sensor and/or a camera using infrared rays, visible light, sound, or the like are arranged below the first area CA, as described below with reference to FIG. 2. The first area CA may include a transmissive portion TA through which light and/or sound that is output from the component to the outside or proceeds from the outside toward the component. According to an embodiment, when infrared rays are transmitted through the first area CA, the light transmittance is about 10% or more, for example, 20% or more, 25% or more, 50% or more, 85% or more, or 90% or more.

A plurality of auxiliary pixels Pa may be arranged in the first area CA, and a certain image may be provided by using light emitted from the plurality of auxiliary pixels Pa. An image provided in the first area CA is an auxiliary image, which may have a lower resolution than an image provided in the display area DA. That is, the first area CA includes the transmissive portion TA through which light and/or sound may pass, and the number of auxiliary pixels Pa that may be arranged per unit area of the first area CA may be less than the number of main pixels Pm arranged per unit area of the display area DA.

The first area CA may be at least partially surrounded by the display area DA, and as an embodiment, FIG. 1 shows that the first area CA is completely surrounded by the display area DA. According to another embodiment, when the first area CA is partially surrounded by the display area DA, one side of the display area DA may have a notch shape.

The first area CA may be singular or plural. As an embodiment, FIG. 1 shows that the display area DA includes one first area CA therein. According to another embodiment, two or more first areas CA may be provided in the display area DA.

A third area PA may be provided to surround the display area DA from the outside, and may be a non-display area in which no pixels are arranged. A plurality of driving circuits may be arranged in the third area PA, as described later below with reference to FIG. 2.

The display apparatus 1 will now be described as, for example, an organic light-emitting display apparatus according to an embodiment, but is not limited thereto. According to another embodiment, the display apparatus 1 may be a display apparatus such as an inorganic light-emitting display apparatus (or inorganic electroluminescent (EL) display apparatus) or a quantum dot light-emitting display. For example, an emission layer of a display element provided in the display apparatus 1 may include an organic material, an inorganic material, a quantum dot, an organic material and a quantum dot, or an inorganic material and a quantum dot.

Meanwhile, FIG. 1 shows that the first area CA is arranged on one side (upper center) of the display area DA that is rectangular, but the embodiment is not limited thereto. The display area DA may be a circle, an ellipse, or a polygon such as a triangle or pentagon, and of course, a position and the number of the first area CA may be changed in various ways.

Figure 2:
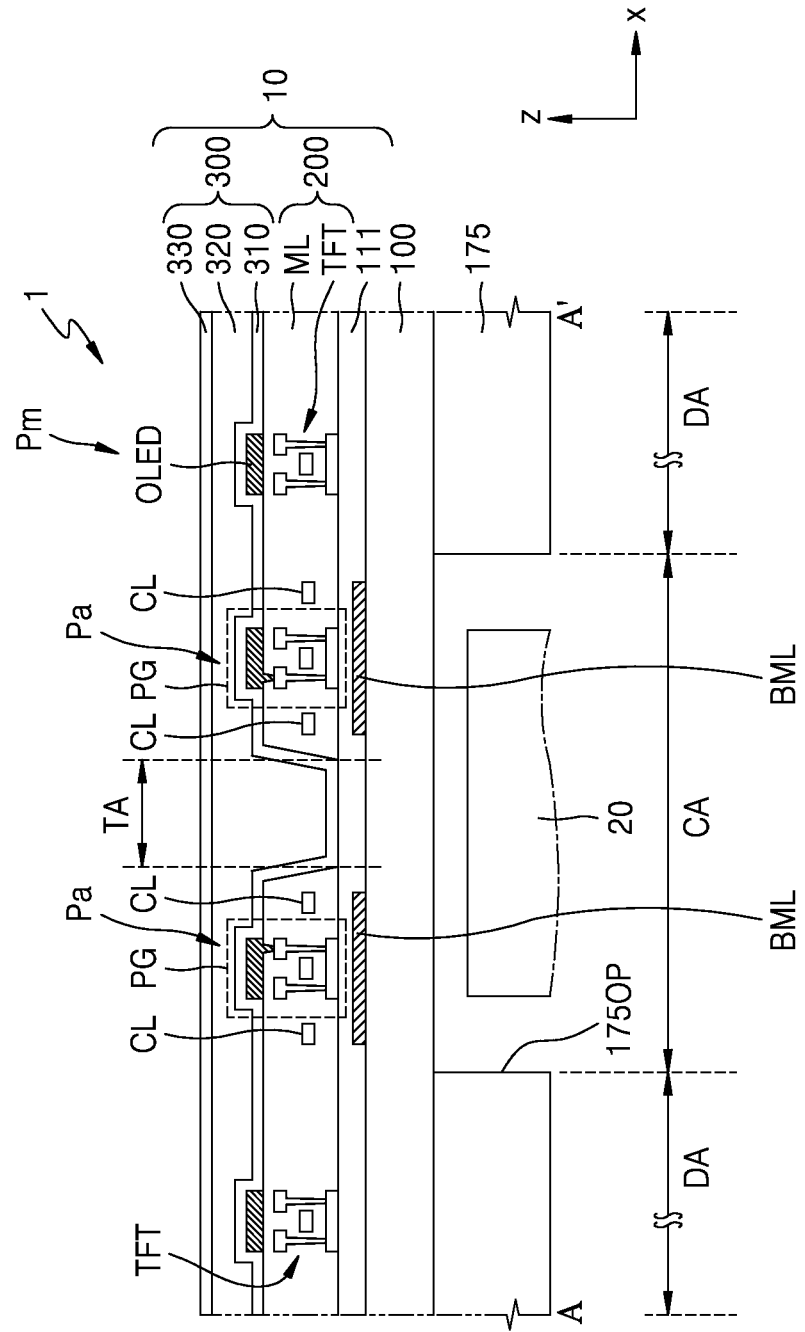
FIG. 2 is a cross-sectional view briefly illustrating a display apparatus according to one or more embodiments of the disclosure, and may correspond to a cross-section of a display apparatus taken along line A-A' in FIG. 1.

FIG. 2 is a cross-sectional view briefly illustrating a display apparatus according to one or more embodiments, and may correspond to a cross-section of a display apparatus taken along line A-A' in FIG. 1.

Referring to FIG. 2, the display apparatus 1 may include a display panel 10 having display elements and a component 20 corresponding to the first area CA.

The display panel 10 may include a substrate 100, a display element layer 200 arranged on the substrate 100, and a thin-film encapsulation layer 300 as a sealing member sealing the display element layer 200. In addition, the display panel 10 may further include a lower protective film 175 below the substrate 100.

The substrate 100 may include glass or a polymer resin. Polymer resins may include, for example, polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 containing a polymer resin may have flexible, rollable, and/or bendable properties. The substrate 100 may have a multi-layer structure including a layer including the above-described polymer resin and an inorganic layer (not shown).

The display element layer 200 may include a circuit layer including a thin-film transistor TFT, an organic light-emitting diode OLED as a display element, and a plurality of insulating layers ML and 111.

A main pixel Pm including the thin-film transistor TFT and the organic light-emitting diode OLED connected thereto may be arranged in the display area DA.

An auxiliary pixel Pa including the thin-film transistor TFT and the organic light-emitting diode OLED connected thereto may be arranged in the first area CA. In the first area CA, the auxiliary pixel Pa may be defined as a pixel group PG in which a plurality of auxiliary pixels Pa are grouped individually. Although FIG. 2 shows that each pixel group PG includes one auxiliary pixel Pa, a plurality of auxiliary pixels Pa may be included in each pixel group PG. A plurality of lines CL respectively connected to the auxiliary pixel Pa may be located around the pixel group PG. The lines CL may be at least one of a data line DL, a driving voltage line PL, a scan line SL, an emission control line EL, a previous scan line SL-1, and an initialization voltage line VL, which will be described later below with reference to FIGS. 3, 4A, and 4B.

A transmissive portion TA in which no display elements are arranged may be located between pixel groups PG of the first area CA. The transmissive portion TA may be an area in which light/signals emitted from the component 20 or incident on the component 20 is/are transmitted.

Some or all of the insulating layer ML corresponding to the transmissive portion TA may be removed. FIG. 1 shows a structure in which all of the insulating layer ML corresponding to the transmissive portion TA is removed. The insulating layer ML may be substantially formed in a multi-layer structure, and some or all of the multi-layer structure may be removed in correspondence with the transmissive portion TA. Thus, by removing the insulating layer ML corresponding to the transmissive portion TA, it is possible to improve the light transmittance of the transmissive portion TA.

The component 20 may be located in the first area CA. The component 20 may be an electronic element that uses light or sound. For example, the component 20 may be a sensor that receives and uses light, such as an infrared sensor, a sensor that outputs and detects light or sound to measure distance, or recognizes a fingerprint, a small lamp that outputs light, a speaker that outputs sound, or a camera including an imaging device. In this case, an electronic element using light may use light of various wavelength bands such as visible light, infrared light, and ultraviolet light. The components 20 arranged in the first area CA may be plural.

A blocking layer BML may be arranged in the first area CA. The blocking layer BML may be arranged to correspond to each of the pixel groups PG. The blocking layer BML may prevent external light, for example, light emitted from the component 20 from reaching the pixel group PG. In addition, the blocking layer BML may prevent reflection or diffraction of light generated while external light passes between the lines CL. Thus, image distortion (e.g., flare and haze) in the first area CA may be prevented.

According to an embodiment, a constant voltage or signal is applied to the blocking layer BML so that damage to a pixel circuit due to electrostatic discharge may be prevented. According to another embodiment, a plurality of blocking layers BML arranged to correspond to the pixel groups PG that are different from each other may be provided with different voltages.

The thin-film encapsulation layer 300 may include at least one inorganic encapsulation layer and at least one organic encapsulation layer. In this regard, FIG. 2 shows first inorganic encapsulation layer 310, a second inorganic encapsulation layer 330, and an organic encapsulation layer 320 therebetween.

The first and second inorganic encapsulation layers 310 and 330 may include one or more inorganic insulating materials from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and/or polyethylene.

The lower protective film 175 may be attached to a lower portion of the substrate 100, and may serve to support and protect the substrate 100. An opening 175OP corresponding to the first area CA may be defined in the lower protective film 175. By providing the opening 175OP on the lower protective film 175, light transmittance of the first area CA may be improved. The lower protective film 175 may include polyethylene terephthalate (PET) or polyimide (PI).

The area of the first area CA may be greater than the area where the component 20 is arranged. Accordingly, the area of the opening 175OP provided on the lower protective film 175 may be greater than the area of the first area CA. For example, the area of the opening 175OP may be less than the area of a first area CA.

Although not shown, on the display panel 10, components such as an input sensing member for sensing a touch input, an antireflection member including a polarizer and a retarder or a color filter and a black matrix, and a transparent window may be further arranged.

Meanwhile, in the present embodiment, the thin-film encapsulation layer 300 is used as a sealing member for sealing the display element layer 200, but the present disclosure is not limited thereto. For example, as a member for sealing the display element layer 200, a sealing substrate which is bonded to the substrate 100 by sealant or frit may be used.

Figure 3:
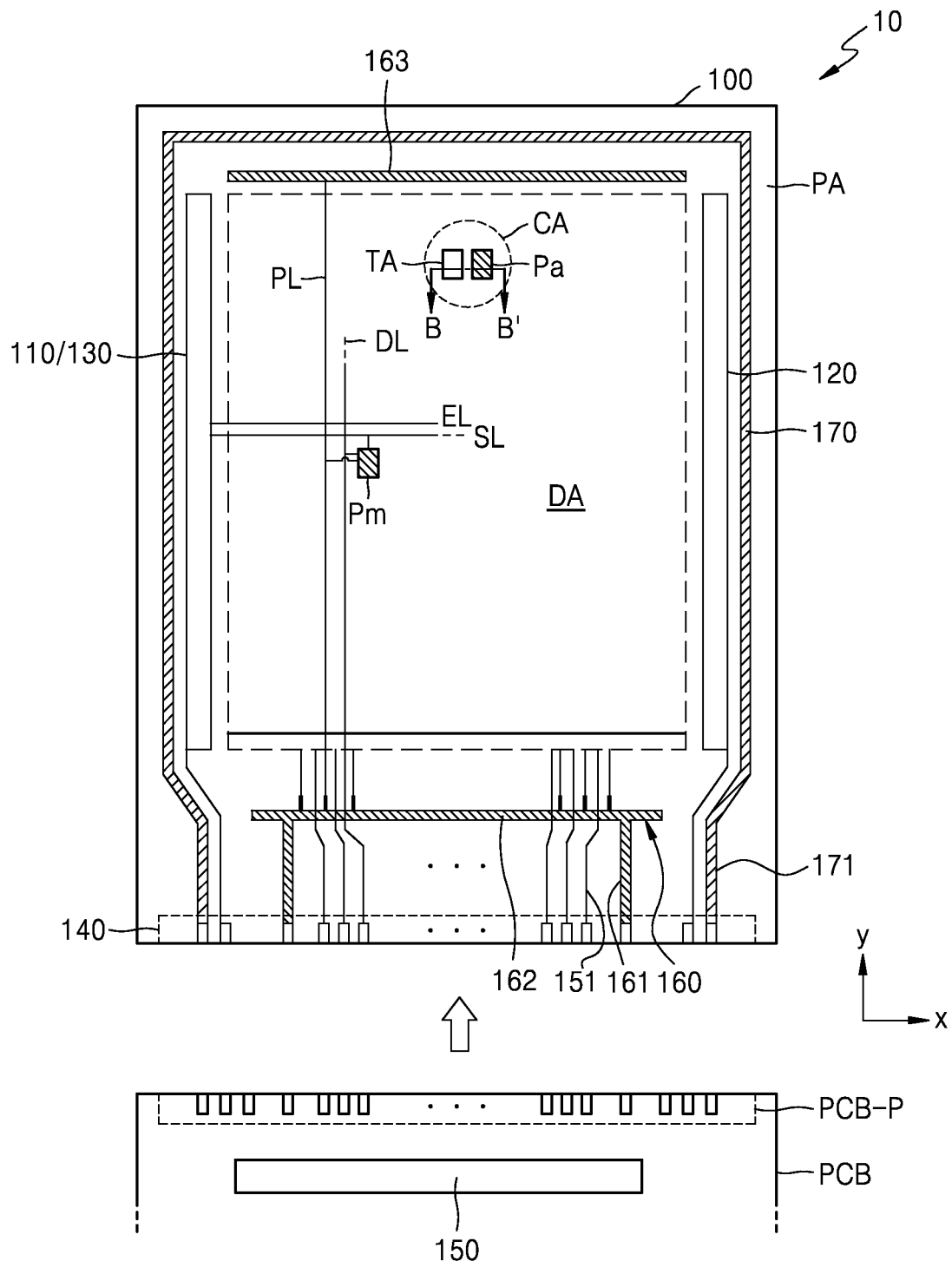
FIG. 3 is a plan view schematically illustrating a display panel according to an embodiment.

FIG. 3 is a plan view schematically illustrating a display panel 10 according to an embodiment.

Referring to FIG. 3, the display panel 10 is arranged in the display area DA and includes a plurality of main pixels Pm. The main pixels Pm may each include a display element such as an organic light-emitting diode. Each of the main pixels Pm may emit, for example, red, green, blue, or white through the organic light-emitting diode. The main pixel Pm in this specification may be understood as a sub-pixel that emits any one of red, green, blue, and white colors, as described above. The display area DA may be covered with a sealing member described with reference to FIG. 2 to be protected from ambient air, moisture, or the like.

The first area CA may be inside the display area DA, and auxiliary pixels Pa may be in the first area CA. The auxiliary pixels Pa may each include display elements such as an organic light-emitting diode. Each of the auxiliary pixels Pa may emit, for example, red, green, blue or white through the organic light-emitting diode. The auxiliary pixel Pa in this specification may be understood as a sub-pixel that emits any one of red, green, blue, and white colors, as described above. These auxiliary pixels Pa may be plural to form the pixel group PG.

Meanwhile, the first area CA includes the transmissive portion TA, and thus, the first area CA may have a lower resolution than the display area DA. For example, a resolution of the first area CA may be about ½ of the display area DA, about ¼, or about ⅛. According to some embodiments, the display area DA may have a resolution of 400 ppi or more, and the first area CA may have a resolution of about 200 ppi, about 100 ppi, or about 50 ppi.

According to an embodiment, one main pixel Pm and one auxiliary pixel Pa may include the same pixel circuit. However, the disclosure is not limited thereto. In this case, a pixel circuit included in the main pixel Pm may be different from a pixel circuit included in the auxiliary pixel Pa. Hereinafter, on the premise that the main pixel Pm and the auxiliary pixel Pa include the same pixel circuit, a circuit arrangement of the display panel 10 will be described with a focus on the main pixel Pm.

Each of the pixels Pm and Pa may be electrically connected to a plurality of outer circuits arranged in the third area PA, which is a non-display area. The third area PA may include a first scan driving circuit 110, a second scan driving circuit 120, an emission control driving circuit 130, a terminal 140, a data driving circuit 150, a first power supply line 160, and a second power supply line 170.

The first scan driving circuit 110 may provide a scan signal to each of the pixels Pm and Pa through the scan line SL. The second scan driving circuit 120 may be arranged side by side with the first scan driving circuit 110 with the display area DA located therebetween. Some of the pixels Pm arranged in the display area DA may be electrically connected to the first scan driving circuit 110, and the others may be connected to the second scan driving circuit 120. According to another embodiment, the second scan driving circuit 120 may be omitted.

The emission control driving circuit 130 is arranged on the side of the first scan driving circuit 110 and may provide an emission control signal to each pixel through an emission control line EL. FIG. 3 illustrates that the emission control driving circuit 130 is arranged only on one side of the display area DA, but the emission control driving circuit 130 may be arranged at opposite sides of the display area DA as in the first and second scan driving circuits 110 and 120.

The terminal 140 may be on one side of the substrate 100. The terminal 140 may be exposed instead of being covered by the insulating layer, and electrically connected to a printed circuit board PCB. A terminal PCB-P of the printed circuit board PCB may be electrically connected to the terminal 140 of the display panel 10. The printed circuit board PCB transmits a signal or power of a controller (not shown) to the display panel 10. Control signals generated by a controller may be transmitted to each of the first and second scan driving circuits 110 and 120 through the printed circuit board PCB. The controller may provide first and second power supply voltages ELVDD and ELVSS (see FIGS. 4A and 4B), respectively, to the first and second power supply lines 160 and 170 through first and second power transmission lines 161 and 171, respectively. The first power voltage (or driving voltage) ELVDD may be provided to each of the pixels Pm and Pa through a driving voltage line PL connected to the first power supply line 160, and the second power voltage ELVSS (or common voltage) may be provided to opposite electrodes of each of the pixels Pm and Pa each connected to the second power supply line 170.

The data driving circuit 150 is electrically connected to a data line DL. A data signal of the data driving circuit 150 may be provided to each of the pixels Pm and Pa through a connection line 151 connected to the terminal 140 and a data line DL connected to the connection line 151. FIG. 3 shows that the data driving circuit 150 is arranged on the printed circuit board PCB. However, according to another embodiment, the data driving circuit 150 may be above the substrate 100. For example, the data driving circuit 150 may be between the terminal 140 and the first power supply line 160.

The first power supply line 160 may include a first sub-line 162 and second sub-line 163 extending side by side along a first direction (x direction) with the display area DA therebetween. The second power supply line 170 is in a loop shape with one side open and may partially enclose the display area DA.

Figure 4A:
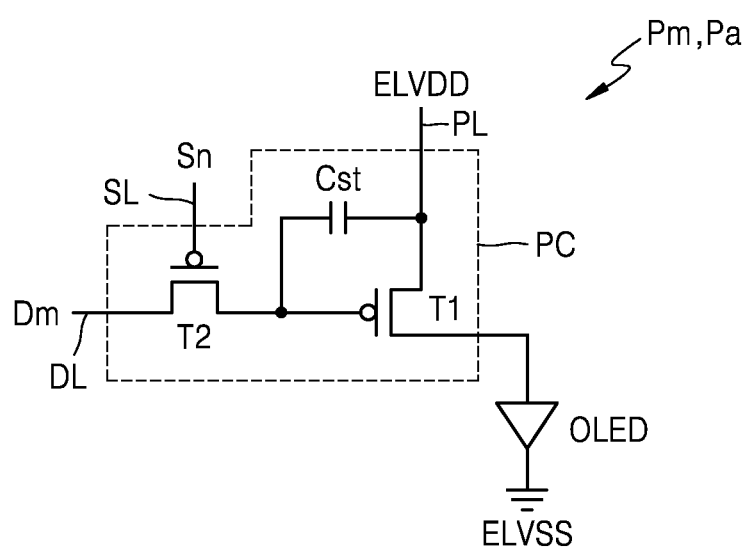
FIGS. 4A and 4B are equivalent circuit diagrams of main pixels and/or auxiliary pixels that may be included a display panel, according to an embodiment.
Figure 4B:
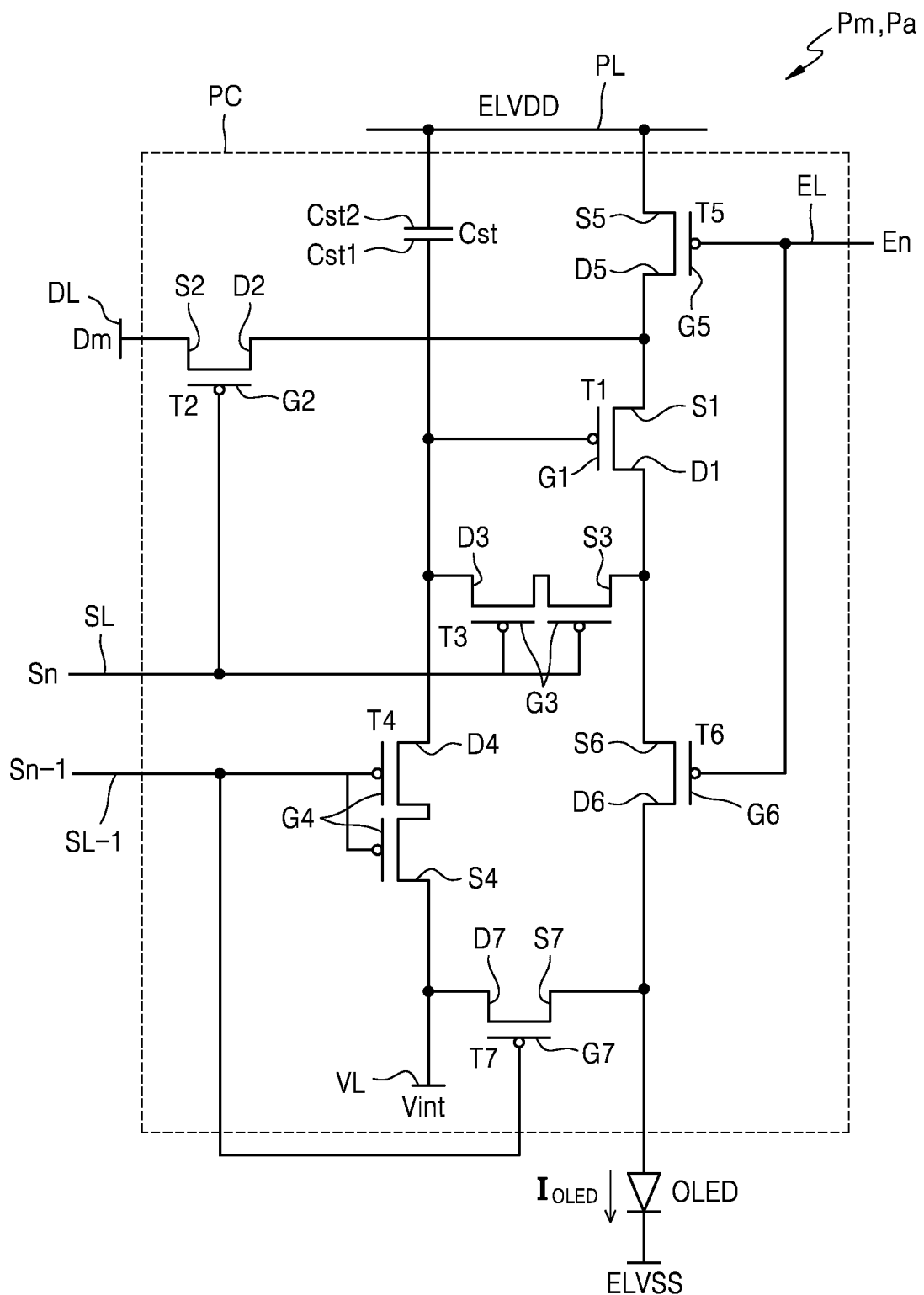

FIGS. 4A and 4B are equivalent circuit diagrams of main pixels and/or auxiliary pixels that may be included a display panel, according to an embodiment.

Referring to FIG. 4A, each of the pixels Pm and Pa includes a pixel circuit PC connected to the scan line SL and the data line DL and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and transmits, to the driving thin-film transistor T1, a data signal Dm received via the data line DL according to a scan signal Sn received via the scan line SL.

The storage capacitor Cst is connected to the switching thin-film transistor T2 and the driving voltage line PL and stores a voltage corresponding to the difference between a voltage received from the switching thin-film transistor T2 and the first power voltage ELVDD supplied to the driving voltage line PL.

The driving thin-film transistor T1 may be connected to the driving voltage line PL and the storage capacitor Cst and may control a driving current flowing from the driving voltage line PL to the organic light-emitting diode OLED to correspond to a voltage value stored in the storage capacitor Cst. The organic light-emitting diode OLED may emit light having a certain luminance corresponding to the driving current.

In FIG. 4A, a case where the pixel circuit PC includes two thin-film transistors and one storage capacitor has been described, but disclosure is not limited thereto. As illustrated in FIG. 4B, the pixel circuit PC may include seven thin-film transistors and one storage capacitor.

Referring to FIG. 4B, each of the pixels Pm and Pa includes a pixel circuit PC and an organic light-emitting diode OLED connected to the pixel circuit PC. The pixel circuit PC may include a plurality of thin-film transistors T1, T2, T3, T4, T5, T6, and T7 and a storage capacitor Cst. The thin-film transistors T1, T2, T3, T4, T5, T6, and T7 and the storage capacitor Cst may be connected to signal lines SL, SL-1, EL, and DL, an initialization voltage line VL, and a driving voltage line PL.

In FIG. 4B, each of the pixels Pm and Pa is connected to the signal lines SL, SL-1, EL, DL, the initialization voltage line VL, and the driving voltage line PL, but the disclosure is not limited thereto. As another embodiment, at least one of the signal lines SL, SL-1, EL, and DL, the initialization voltage line VL, the driving voltage line PL, and the like may be shared by neighboring pixels.

The plurality of thin-film transistors may include a driving thin-film transistor (driving TFT) T1, a switching thin-film transistor (switching TFT) T2, a compensation thin-film transistor T3, and a first initialization thin-film transistor T4, an operation control thin-film transistor T5, an emission control thin-film transistor T6, and a second initialization thin-film transistor T7.

The signal lines include a scan line SL for transmitting a scan signal Sn, a previous scan line SL-1 for transmitting a previous scan signal Sn-1 to the first initialization thin-film transistor T4 and the second initialization thin-film transistor T7, an emission control line EL for transmitting an emission control signal En to the emission control thin-film transistor T6 and the emission control thin-film transistor T6, and a data line DL intersecting with the scan line SL to transmit a data signal Dm. The driving voltage line PL transmits the driving voltage ELVDD to the driving TFT T1, and the initialization voltage line VL transmits an initialization voltage $V_{int}$ that initializes a pixel electrode.

A driving gate electrode G1 of the driving TFT T1 is connected to a first electrode Cst1 of the storage capacitor Cst, a driving source electrode S1 of the driving TFT T1 is connected to a lower driving voltage line PL via the operation control thin-film transistor T5, and a driving drain electrode D1 of the driving TFT T1 is electrically connected to a pixel electrode of a main organic light-emitting diode OLED via the emission control thin-film transistor T6. The driving TFT T1 receives the data signal Dm according to a switching operation of the switching TFT T2 and supplies a driving current (IDLED) to the main organic light-emitting diode OLED.

A switching gate electrode G2 of the switching TFT T2 is connected to the scan line SL, a switching source electrode S2 of the switching TFT T2 is connected to the data line DL, and a switching drain electrode D2 of the switching TFT is connected to the driving voltage line PL via the operation control thin-film transistor T5 while being connected to the driving source electrode S1 of the driving TFT T1. The switching TFT T2 is turned on according to the scan signal Sn received through the scan line SL and performs a switching operation to transmit the data signal Dm transmitted to the data line DL to the driving source electrode S1 of the driving TFT T1.

A compensation gate electrode G3 of the compensation thin-film transistor T3 is connected to scan line SL, a compensation source electrode S3 of the compensation thin-film transistor T3 is connected to the pixel electrode of the organic light-emitting diode OLED via the emission control thin-film transistor T6 while being connected to the driving drain electrode D1 of the driving TFT T1, and a compensation drain electrode D3 of the compensation thin-film transistor T3 is connected to the first electrode Cst1 of the compensation thin-film transistor T3, a first initialization drain electrode D4 of the first initialization thin-film transistor T4, and the driving gate electrode G1 of the driving TFT T1. The compensation thin-film transistor T3 is turned on according to the scan signal Sn received through the scan line SL and electrically connects the driving gate electrode G1 of the driving TFT T1 to the driving drain electrode D1 of the driving TFT T1 to diode-connect the driving TFT T1.

A first initialization gate electrode G4 of the first initialization thin-film transistor T4 is connected to the previous scan line SL-1, a first initialization source electrode S4 of the first initialization thin-film transistor T4 is connected to a second initialization drain electrode D7 of the second initialization thin-film transistor T7 and the initialization voltage line VL, and the first initialization drain electrode D4 of the first initialization thin-film transistor T4 is connected to the first electrode Cst1 of the storage capacitor Cst, the compensation drain electrode D3 of the compensation thin-film transistor T3, and the driving gate electrode G1 of the driving TFT T1. The first initialization thin-film transistor T4 is turned on according to the previous scan signal Sn-1 received through the previous scan line SL-1, and performs an initialization operation to initialize a voltage of the driving gate electrode G1 of the driving TFT T1 by transmitting the initialization voltage $V_{int}$ to the driving gate electrode G1 of the driving TFT T1.

An operation control gate electrode G5 of the operation control thin-film transistor T5 is connected to the emission control line EL, an operation control source electrode S5 of the operation control thin-film transistor T5 is connected to the lower driving voltage line PL, and an operation control drain electrode D5 of the operation control thin-film transistor T5 is connected to the driving source electrode S1 of the driving TFT T1 and the switching drain electrode D2 of the switching TFT T2.

An emission control gate electrode G6 of the emission control thin-film transistor T6 is connected to the emission control line EL, an emission control source electrode S6 of the emission control thin-film transistor T6 is connected to the driving drain electrode D1 of the driving TFT T1 and the compensation source electrode S3 of the compensation thin-film transistor T3, and an emission control drain electrode D6 of the emission control thin-film transistor T6 is electrically connected to a second initialization source electrode S7 of the second initialization thin-film transistor T7 and the pixel electrode of the organic light-emitting diode OLED.

The operation control thin-film transistor T5 and the emission control thin-film transistor T6 are simultaneously turned on according to the emission control signal En received through the emission control line EL, and the driving voltage ELVDD is transmitted to the main organic light-emitting diode OLED, so that the driving current $I_{OLED}$ may flow through the organic light-emitting diode OLED.

A second initialization gate electrode G7 of the second initialization thin-film transistor T7 is connected to the previous scan line SL-1, the second initialization source electrode S7 of the second initialization thin-film transistor T7 is connected to the emission control drain electrode D6 of the emission control thin-film transistor T6 and the pixel electrode of the main organic light-emitting diode OLED, and the second initialization drain electrode D7 of the second initialization thin-film transistor T7 is connected to the first initialization source electrode S4 of the first initialization thin-film transistor T4 and the initialization voltage line VL. The second initialization thin-film transistor T7 is turned on according to the previous scan signal Sn-1 received through the previous scan line SL-1 to initialize the pixel electrode of the main organic light-emitting diode OLED.

FIG. 4B shows a case where the first initialization thin-film transistor T4 and the second initialization thin-film transistor T7 are connected to the previous scan line SL-1, but the disclosure is not limited thereto. According to another embodiment, the first initialization thin-film transistor T4 may be connected to the previous scan line SL-1 and driven according to the previous scan signal Sn-1, and the second initialization thin-film transistor T7 may be a separate signal line (e.g., a next scan line) and may be driven according to a signal transmitted to the signal line.

A second electrode Cst2 of the storage capacitor Cst is connected to the driving voltage line PL, and the opposite electrode of the organic light-emitting diode OLED is connected to the second power voltage ELVSS. Accordingly, the organic light-emitting diode OLED may display an image by receiving the driving current IDLED from the driving TFT T1 and emitting light by.

In FIG. 4B, the compensation thin-film transistor T3 and the first initialization thin-film transistor T4 are illustrated as having dual gate electrodes, but the compensation thin-film transistor T3 and the first initialization thin-film transistor T4 may have one gate electrode.

In the present embodiment, the main pixel Pm and the auxiliary pixel Pa may have the same pixel circuit PC. However, the disclosure is not limited thereto. The main pixel Pm and the auxiliary pixel Pa may have pixel circuits PC having different structures. Various modifications are possible. For example, the main pixel Pm may employ the pixel circuit of FIG. 4B, and the auxiliary pixel Pa may employ the pixel circuit of FIG. 4A.

Figure 5:
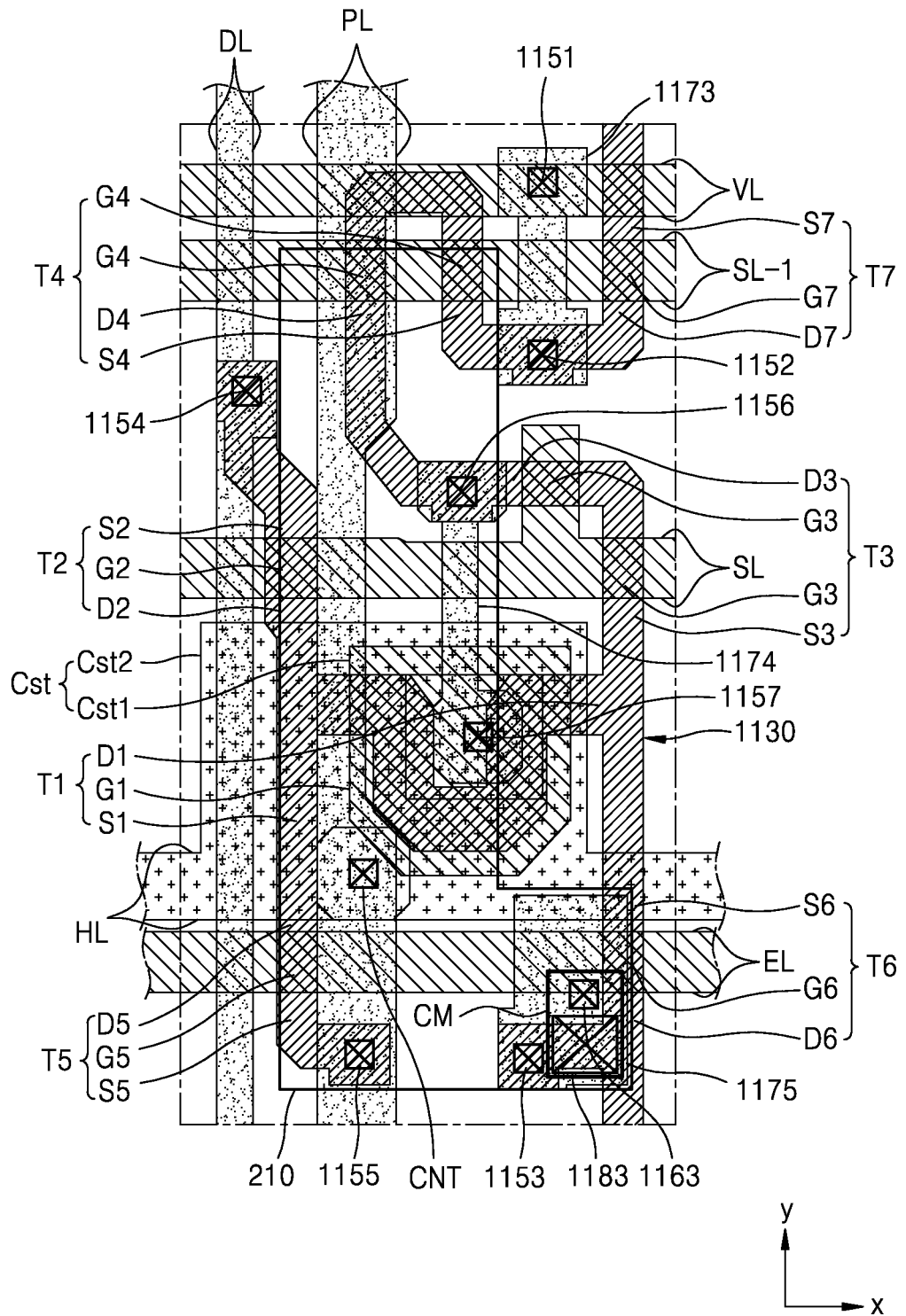
FIG. 5 is a layout view of a pixel circuit of a pixel of the display panel according to an embodiment.

FIG. 5 is a layout view of a pixel circuit of a pixel of the display panel according to an embodiment.

Referring to FIG. 5, the driving TFT T1, the switching TFT T2, the compensation thin-film transistor T3, the first initialization thin-film transistor T4, the operation control thin-film transistor T5, the emission control thin-film transistor T6, and the second initialization thin-film transistor T7 are arranged along a semiconductor layer 1130. The semiconductor layer 1130 is on a substrate above which a buffer layer, which is an inorganic insulating material, is formed.

Some areas of the semiconductor layer 1130 correspond to semiconductor layers of the driving TFT T1, the switching TFT T2, the compensation thin-film transistor T3, the first initialization thin-film transistor T4, the operation control thin-film transistor T5, the emission control thin-film transistor T6, and second initialization thin-film transistor T7. In other words, the semiconductor layers of the driving TFT T1, the switching TFT T2, the compensation thin-film transistor T3, the first initialization thin-film transistor T4, the operation control thin-film transistor T5, the emission control thin-film transistor T6, and the second initialization thin-film transistor T7 may be connected to one other and may be curved in various shapes.

The semiconductor layer 1130 includes a channel area, and a source area and drain area at opposite sides of the channel area, and the source area and the drain area may be understood as source and drain electrodes of the corresponding thin-film transistor. Hereinafter, for convenience, the source area and the drain area are referred to as a source electrode and a drain electrode, respectively.

The driving TFT T1 includes the driving gate electrode G1 overlapping a driving channel area, and the driving source electrode S1 and driving drain electrode D1 at opposite sides of the driving channel area. The driving channel area overlapping the driving gate electrode G1 has a bent shape such as an omega shape so that a long channel length may be formed in a narrow space. When the driving channel area is long, the driving range of a gate voltage is widened so that the gradation of light emitted from the organic light-emitting diode OLED may be more precisely controlled, and thus, display quality may be improved.

The switching TFT T2 includes the switching gate electrode G2 overlapping a switching channel area, and the switching source electrode S2 and the switching drain electrode D2 at opposite sides of the switching channel area. The switching drain electrode D2 may be connected to the driving source electrode S1.

The compensation thin-film transistor T3 is a dual thin-film transistor, which may include compensation gate electrodes G3 overlapping two compensation channel areas, and the compensation source electrode S3 and compensation drain electrode D3 arranged at opposite sides of a compensation gate electrode G3. The compensation thin-film transistor T3 may be connected to the driving gate electrode G1 of the driving TFT T1 through a node connection line 1174 to be described later below.

The first initialization thin-film transistor T4 is a dual thin-film transistor, which may include the first initialization gate electrode G4 overlapping two first initialization channel areas, and the first initialization source electrode S4 and first initialization drain electrode D4 arranged at opposite sides of the first initialization gate electrode G4.

The operation control thin-film transistor T5 may include the operation control gate electrode G5 overlapping an operation control channel area, and an operation control source electrode S5 and operation control drain electrode D5 located at opposite sides of the operation control gate electrode G5. The operation control drain electrode D5 may be connected to the driving source electrode S1.

The emission control thin-film transistor T6 may include the emission control gate electrode G6 overlapping an emission control channel area, and the emission control source electrode S6 and emission control drain electrode D6 located at opposite sides of the emission control gate electrode G6. The emission control source electrode S6 may be connected to the driving drain electrode D1.

The second initialization thin-film transistor T7 may include the second initialization gate electrode G7 overlapping a second initialization channel area, and the second initialization source electrode S7 and second initialization drain electrode D7 located at opposite sides of the second initialization gate electrode G7.

The above-described thin-film transistors may be connected to the signal lines SL, SL-1, EL and DL, the initialization voltage line VL, and the driving voltage line PL.

The scan line SL, the previous scan line SL-1, the emission control line EL, and the driving gate electrode G1 may be arranged on the semiconductor layer 1130 described above, with an insulating layer(s) therebetween.

The scan line SL may extend along the first direction (x direction). One or more areas of the scan line SL may correspond to the switching and compensation gate electrodes G2 and G3. For example, areas overlapping the channel areas of the switching and compensation thin-film transistors T2 and T3 from among the scan line SL may be the switching and compensation gate electrodes G2 and G3, respectively.

The previous scan line SL-1 may extend along the first direction (x direction), wherein some areas correspond to first and second initialization gate electrodes G4 and G7, respectively. For example, areas of the previous scan line SL-1 that overlap channel areas of the first and second initialization driving TFTs T4 and T7 may be the first and second initialization gate electrodes G4 and G7, respectively.

The emission control line EL extends along the first direction (x direction). One or more areas of the emission control line EL may correspond to the operation control gate electrode G5 and the emission control gate electrode G6, respectively. For example, areas of the emission control line EL that overlap channel areas of the operation control driving TFT T6 and the emission control driving TFT T7 may be the operation control gate electrode G5 and emission control gate electrode G6, respectively.

The driving gate electrode G1 is a floating electrode, and may be connected to the compensation thin-film transistor T3 through the node connection line 1174 described above.

An electrode voltage line HL may be arranged on the scan line SL, the previous scan line SL-1, the emission control line EL, and the driving gate electrode G1 with an insulating layer(s) therebetween.

The electrode voltage line HL may extend along the first direction (x direction) to intersect with the data line DL and the driving voltage line PL. A portion of the electrode voltage line HL may cover at least a portion of the driving gate electrode G1 and may form the storage capacitor Cst together with the driving gate electrode G1. For example, the driving gate electrode G1 may be the first electrode Cst1 of the storage capacitor Cst, and a portion of the electrode voltage line HL may be the second electrode Cst2 of the storage capacitor Cst.

The second electrode Cst2 of the storage capacitor Cst is electrically connected to the driving voltage line PL. In this regard, the electrode voltage line HL may be connected to the driving voltage line PL arranged on the electrode voltage line HL through a contact hole CNT. Therefore, the electrode voltage line HL may have the same voltage level (constant voltage) as the driving voltage line PL. For example, the electrode voltage line HL may have a constant voltage of +5V. The electrode voltage line HL may be understood as a transverse driving voltage line.

The driving voltage line PL extends along a second direction (y direction), and the electrode voltage line HL electrically connected to the driving voltage line PL extends along the first direction (x direction) crossing the second direction (y direction). Therefore, a plurality of driving voltage lines PL and a plurality of electrode voltage lines HL in the display area may form a mesh structure.

The data line DL, the driving voltage line PL, an initialization connection line 1173, and the node connection line 1174 may be arranged on the electrode voltage line HL with an insulating layer(s) therebetween.

The data line DL extends in the second direction (y direction) and may be connected to the switching source electrode S2 of the switching TFT T2 through a contact hole 1154. A portion of the data line DL may be understood as a switching source electrode.

The driving voltage line PL extends in the second direction (y direction), and is connected to the electrode voltage line HL through the contact hole CNT, as described above. In addition, the driving voltage line PL may be connected to the operation control thin-film transistor T5 through a contact hole 1155. The driving voltage line PL may be connected to the operation control drain electrode D5 through the contact hole 1155.

One end of the initialization connection line 1173 may be connected to the first and second initialization thin-film transistors T4 and T7 through a contact hole 1152, and the other end may be connected to the initialization voltage line VL to be described later below, through a contact hole 1151.

One end of the node connection line 1174 may be connected to the compensation drain electrode D3 through a contact hole 1156 and the other end may be connected to the driving gate electrode G1 through a contact hole 1157.

The initialization voltage line VL may be arranged on the data line DL, the driving voltage line PL, the initialization connection line 1173, and the node connection line 1174 with an insulating layer(s) therebetween.

The initialization voltage line VL extends in the first direction (x direction). The initialization voltage line VL may be connected to the first and second initialization driving TFTs T4 and T7 through the initialization connection line 1173. The initialization voltage line VL may have a constant voltage (e.g., −2V or the like).

The initialization voltage line VL is arranged on the same layer as a pixel electrode 210 of the organic light emitting diode OLED (see FIG. 6) and may include the same material. The pixel electrode 210 may be connected to the emission control thin-film transistor T6. The pixel electrode 210 may be connected to a contact metal layer CM through a contact hole 1183, the contact metal layer CM may be connected to an electrode layer 1175 through a contact hole 1163, and the electrode layer 1175 may access the emission control drain electrode D6 via a contact hole 1153.

In FIG. 5, the initialization voltage line VL is arranged on the same layer as the pixel electrode 210. However, according to another embodiment, the initialization voltage line VL may be arranged on the same layer as the electrode voltage line HL.

As described above, a circuit layout illustrated in FIG. 5 is only an example, and the circuit arrangement of the pixels Pm and Pa of the present disclosure may be modified in various ways as long as an equivalent circuit diagram of FIG. 4A or 4B is satisfied.

Figure 6:
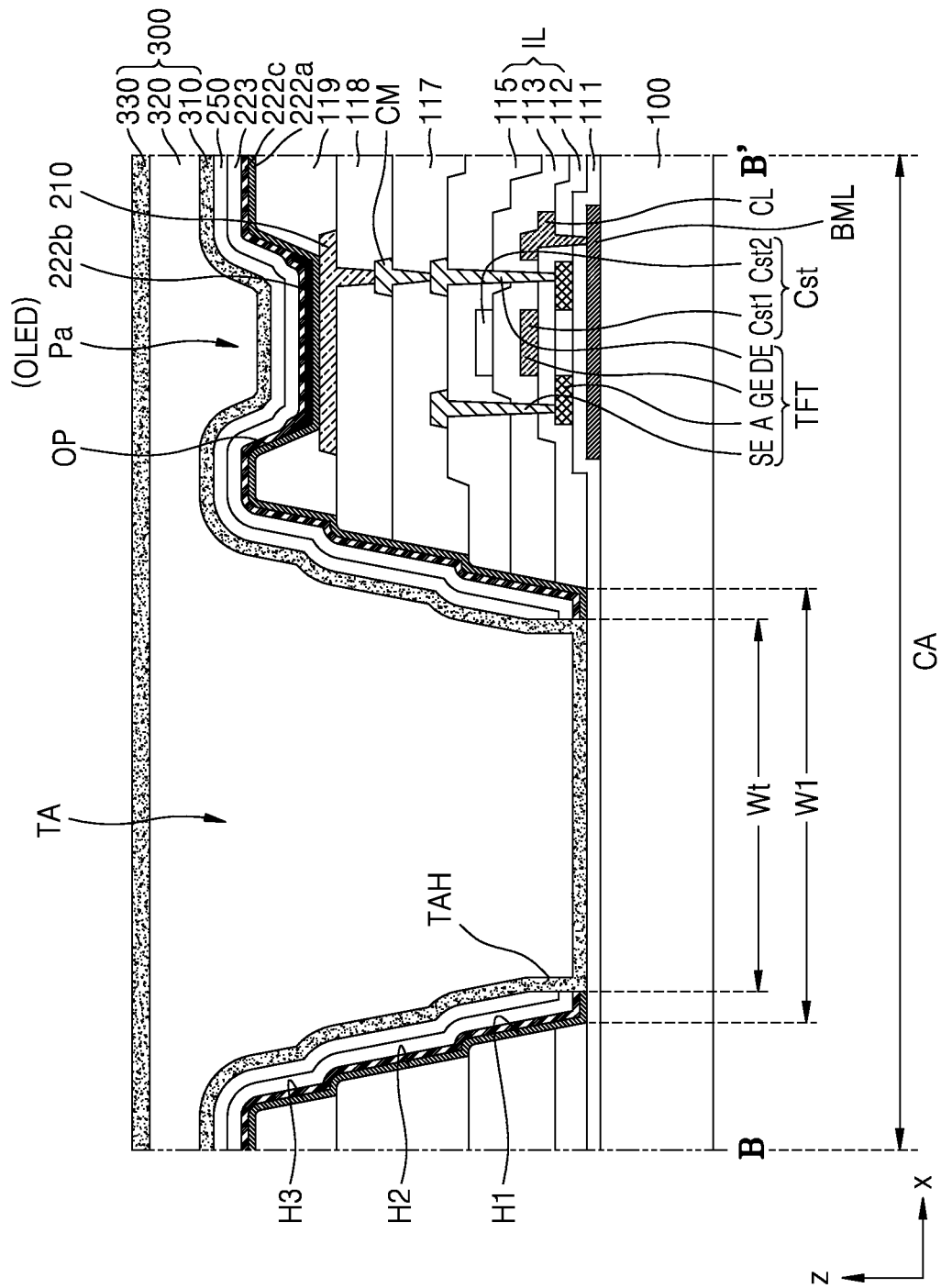
FIG. 6 is a schematic cross-sectional view illustrating a pixel circuit of a pixel according to an embodiment, and corresponds to a cross-section of the display panel in FIG. 3 taken along line A-A' in FIG. 3.

FIG. 6 is a cross-sectional view schematically illustrating a pixel circuit of a pixel according to an embodiment. FIG. 6 corresponds to a cross-section of the display panel taken along the line A-A' in FIG. 3.

Referring to FIG. 6, the auxiliary pixel Pa (hereinafter, the pixel Pa) and the transmissive portion TA are arranged in the first area CA. Hereinafter, a stacked structure of the pixel Pa will be described with reference to the cross-sectional structure of the first area CA.

The pixel Pa may include the thin-film transistor TFT, the storage capacitor Cst, and the organic light-emitting diode OLED. The transmissive portion TA may include a transmission hole TAH from which some insulating layers are removed so that the light transmittance may be secured.

Meanwhile, a thin-film transistor TFT of FIG. 6 may be one of the thin-film transistors illustrated in FIG. 4A or 4B described above. According to an embodiment, the thin-film transistor TFT of FIG. 6 may correspond to the driving TFT T1 of FIGS. 4B and 5.

Below the thin-film transistor TFT of the pixel Pa, a blocking layer BML may be arranged so as to overlap the thin-film transistor TFT. Meanwhile, unlike FIG. 6, the blocking layer BML arranged to overlap the thin-film transistor TFT may be omitted. The blocking layer BML may be arranged directly on the substrate 100, as shown in FIG. 6, or after a barrier layer is formed on the substrate 100, the blocking layer BML may be arranged on the barrier layer.

The substrate 100 may include a polymer resin. The substrate 100 may include at least one base layer containing an organic material, and at least one inorganic layer. Although not shown, according to an embodiment, the substrate 100 may include a first base layer, a first inorganic layer, a second base layer, and a second inorganic layer stacked sequentially. Each of the first and second base layers may include a polymer resin, and each of the first and second inorganic layers is a barrier layer that prevent penetration of foreign substances, and may be a single layer or multi-layer containing inorganic materials such as silicon nitride ($SiN_x$) and/or silicon oxide ($SiO_x$).

The buffer layer 111 may be arranged on the substrate 100 and may reduce or prevent a foreign material, moisture, or ambient air from penetrating below the substrate 100 and may provide a flat surface on the substrate 100. The buffer layer 111 may include an inorganic material such as an oxide or nitride, an organic material, or an organic-inorganic composite material, and may be formed in a single layer or a multiple layers of an inorganic material or organic material.

The blocking layer BML may be arranged between the substrate 100 and the buffer layer 111. According to another embodiment, the blocking layer BML may be arranged between a plurality of layers forming the substrate 100. For example, the blocking layer BML may be arranged between the second base layer and the second inorganic layer. According to another embodiment, in the first area CA, the blocking layer BML may be plural, and some of the plurality of blocking layers BML may be arranged on different layers.

The blocking layer BML may be arranged below the pixel Pa to prevent the thin-film transistor TFT arranged on the pixel Pa from being damaged or to prevent deterioration of the characteristics of the thin-film transistor TFT.

Meanwhile, the blocking layer BML may be connected to a line CL arranged on another layer, through a contact hole. The blocking layer BML may be provided with a constant voltage or signal from the line CL. For example, the blocking layer BML may be provided with the driving voltage ELVDD or scan signal. By receiving a constant voltage or signal, the blocking layer BML may significantly reduce the probability of occurrence of electrostatic discharge. According to another embodiment, all of the blocking layer BML may not receive an electrical signal. In this regard, various modifications are possible. For example, when a plurality of blocking layers BML are provided, at least one of the plurality of blocking layers BML may be electrically floated, and the rest may receive an electrical signal.

The blocking layer BML may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu). The blocking layer BML may be a single layer or multiple layers of the aforementioned materials.

The thin-film transistor TFT may be arranged on the buffer layer 111. The thin-film transistor TFT includes a semiconductor layer A, a gate electrode GE, a source electrode SE, and a drain electrode DE, wherein the source electrode SE and the drain electrode DE are electrode layers. The thin-film transistor TFT may be connected to the organic light-emitting diode OLED to drive the organic light-emitting diode OLED.

The semiconductor layer A may be arranged on the buffer layer 111 and may include polysilicon. According to another embodiment, the semiconductor layer A may include amorphous silicon. According to another embodiment, the semiconductor layer A may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer A may include a channel area, a source area, and a drain area, wherein the source area and the drain area are doped with impurities.

The semiconductor layer A may overlap the blocking layer BML with the buffer layer 111 therebetween. According to an embodiment, a width of the semiconductor layer A may be formed less than a width of the blocking layer BML, and thus, when projected in a direction perpendicular to the substrate 100, the semiconductor layer A may overlap the blocking layer BML as a whole. In addition, according to an embodiment, the blocking layer BML may be provided to correspond to the pixel group Pa that is formed by gathering the plurality of pixels Pa. In this case, a plurality of semiconductor layers A may overlap the blocking layer BML.

A first gate insulating layer 112 may be provided to cover the semiconductor layers A. The first gate insulating layer 112 may include an inorganic insulating material such as silicon dioxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium oxide ($HfO_2$), or zinc peroxide ($ZnO_2$). The first gate insulating layer 112 may be a single layer or multiple layers including the above-described inorganic insulating material.

A gate electrode GE is arranged on the first gate insulating layer 112 so as to overlap each of the semiconductor layers A. The gate electrode GE includes molybdenum (Mo), aluminum (Al), copper (Cu), titanium (Ti), and the like, and may be formed in a single layer or multiple layers. For example, the gate electrode GE may be a single layer including Mo.

A second gate insulating layer 113 may be provided to cover the gate electrode GE. The second gate insulating layer 113 may include an inorganic insulating material such as $SiO_2$, $SiN_x$, SiON, $Al_2O_3$, titanium dioxide ($TiO_2$), $Ta_2O_5$, $HfO_2$, or $ZnO_2$. The second gate insulating layer 113 may be a single layer or multiple layers including the above-described inorganic insulating material.

The second electrode Cst2 of the storage capacitor Cst may be arranged on the second gate insulating layer 113. In a pixel circuit PC according to the present embodiment, the second electrode Cst2 may overlap the gate electrode GE below the second electrode Cst2. The gate electrode GE and the second electrode Cst, which overlap each other with the second gate insulating layer 113 therebetween, may form the storage capacitor Cst. The gate electrode GE may be the first electrode Cst1 of the storage capacitor Cst.

The second electrode Cst2 may include Al, platinum (Pt), palladium (Pd), silver (Ag), magnesium (Mg), gold (Au), nickel (Ni), neodymium (Nd), iridium (Ir), chromium (Cr), nickel (Li), calcium (Ca), Mo, Ti, tungsten (W), and/or Cu, and may be a single layer or multiple layers.

An interlayer insulating layer 115 may be formed to cover the second electrode Cst2. The interlayer insulating layer 115 may include $SiO_2$, $SiN_x$, SiON, $Al_2O_3$, $TiO_2$, $Ta_2O_5$, $HfO_2$, or $ZnO_2$.

When the first gate insulating layer 112, the second gate insulating layer 113, and the interlayer insulating layer 115 are collectively referred to as an inorganic insulating layer IL, a first hole H1 corresponding to the transmissive portion TA is defined in the inorganic insulating layer IL. The first hole H1 may be formed such that an upper surface of the buffer layer 111 or substrate 100 is exposed. The first hole H1 may be formed by overlapping openings of the first gate insulating layer 112, the second gate insulating layer 113, and the interlayer insulating layer 115, wherein the openings are formed to correspond to the transmissive portion TA. The openings may be formed through separate processes individually or simultaneously through the same process. When the openings are formed through separate processes, a step may be formed on the inner side surface of the first hole H1.

According to another embodiment, the inorganic insulating layer IL may have a groove rather than the first hole H1 exposing the buffer layer 111.

According to another embodiment, the first hole H1 corresponding to the transmissive portion TA may not be defined in the inorganic insulating layer IL. The inorganic insulating layer IL generally includes an inorganic insulating material having excellent light transmittance, and thus, the transmittance of light that may be transmitted/received by the component 20 (see FIG. 2) may be implemented, even when an opening corresponding to the transmissive portion TA is not provided.

The source electrode SE and the drain electrode DE that are understood as electrode layers are arranged on the interlayer insulating layer 115. The source electrode SE and the drain electrode DE may include a conductive material including Mo, Al, Cu, Ti, and the like and may be formed as a single layer or multiple layers including the above material. For example, the source electrode SE and the drain electrode DE may have a multi-layer structure of Ti/Al/Ti.

A first organic insulating layer 117 may be arranged to cover the source electrode SE and the drain electrode DE. The first organic insulating layer 117 may have a flat upper surface so that the pixel electrode 210 arranged thereon may be formed flat.

A second organic insulating layer 118 may be arranged on the first organic insulating layer 117. The contact metal layer CM may be arranged between the first organic insulating layer 117 and the second organic insulating layer 118. The contact metal layer CM may electrically connect the drain electrode DE to the pixel electrode 210 through contact holes respectively formed in the first organic insulating layer 117 and the second organic insulating layer 118.

The first and second organic insulating layers 117 and 118 may be formed of a single layer or multiple layers of an organic or inorganic material. The first and second organic insulating layers 117 and 118 may include general-purpose polymers such as BCB, PI, HMDSO, PMMA, and PS, and polymer derivatives having phenol-based groups, acrylic polymer, imide polymer, aryl ether polymer, amide polymer, fluorine polymer, p-xylene polymer, vinyl alcohol polymer, blends thereof, and the like. Meanwhile, the first and second organic insulating layers 117 and 118 may include $SiO_2$, $SiN_x$, SiON, $Al_2O_3$, $TiO_2$, $Ta_2O_5$, and $HfO_2$, or $ZnO_2$. After the first and second organic insulating layers 117 and 118 are formed, chemical and mechanical polishing may be performed to provide a flat upper surface.

Figure 8:
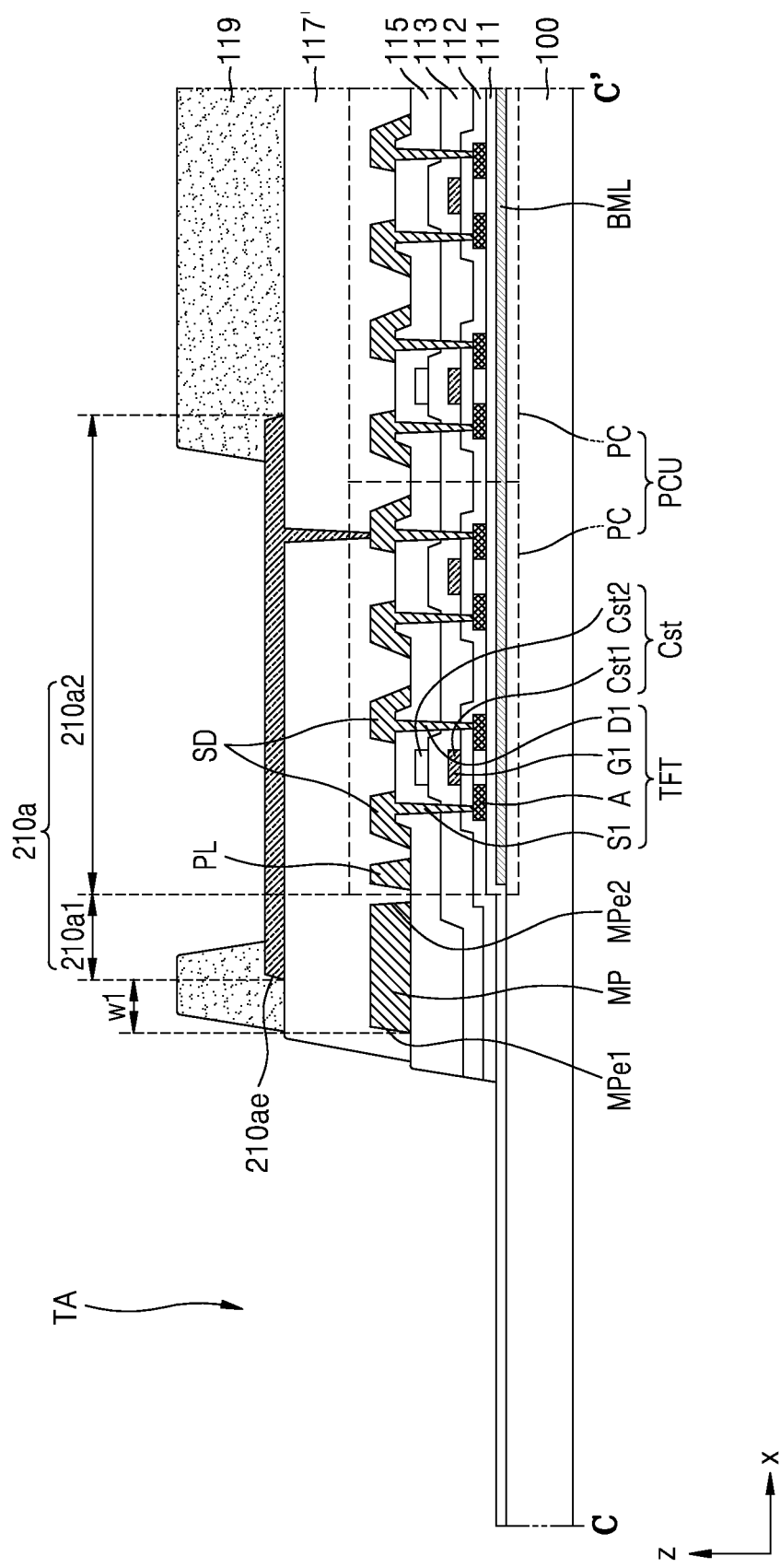
FIGS. 8 and 9 are cross-sectional views schematically illustrating a cross-section of the display apparatus of FIG. 7 taken along line C-C' in FIG. 7.

Meanwhile, FIG. 6 illustrates an embodiment in which the first and second organic insulating layers 117 and 118 are provided, but according to another embodiment, an organic insulating layer 117' that is a single layer may be provided, as shown in FIG. 8.

Aa second hole H2 corresponding to the transmissive portion TA may be defined in the first and second organic insulating layers 117 and 118. The second hole H2 may be arranged to overlap the first hole H1. FIG. 6 shows that the second hole H2 is formed larger than the first hole H1, but the first and second organic insulating layers 117 and 118 may be provided to cover the edge of the first hole H1 of the inorganic insulating layer IL, and a width of the second hole H2 may be less than a width of the first hole H1.

The pixel electrode 210 on the second organic insulating layer 118 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode 210 may include a reflective film containing Ag, Mg, Al, Pt, Pd, Au, Ni, Nd, Ir, Cr, or a compound thereof. According to another embodiment, the pixel electrode 210 may further include a film formed of ITO, IZO, ZnO, or $In_2O_3$ above and below the above-described reflective film. For example, the pixel electrode 210 may be provided in a stacked structure of ITO/Ag/ITO.

A pixel defining layer 119 may cover an edge of each of the pixel electrodes 210. The pixel defining layer 119 overlaps each of the pixel electrodes 210 and includes an opening OP defining an emission area of the pixel. The opening OP may be defined as an emission area in the pixel Pa. The pixel defining layer 119 may serve to prevent arcs or the like from occurring at an edge of the pixel electrode 210 by increasing a distance between the edge of the pixel electrode 210 and an opposite electrode 223 above the pixel electrode 210. The pixel defining layer 119 is an organic insulating material such as PI, polyamide, acrylic resin, BCB, HMDSO, and phenol resin, and may be formed by spin coating or the like.

A third hole H3 corresponding to the transmissive portion TA may be defined in the pixel defining layer 119. The third hole H3 may overlap the first hole H1 and the second hole H2. When the first, second, and third holes H1, H2, and H3 are formed, light transmittance of the transmissive portion TA may be improved. The opposite electrode 223 to be described later below may be arranged on inner side walls of the first, second, and third holes H1, H2, and H3.

A first functional layer 222a is arranged to cover the pixel defining layer 119. The first functional layer 222a may be a single layer or multiple layers. The first functional layer 222a may be a hole transport layer (HTL) that has a single layer structure. Alternatively, the first functional layer 222a may include a hole injection layer (HIL) and an HTL. The first functional layer 222a may be integrally formed to commonly correspond to pixels Pa included in the first area CA and the display area DA.

On the first functional layer 222a, an emission layer 222b formed to correspond to each of the pixel electrodes 210 is arranged. The emission layer 222b may include a high molecular weight material or a low molecular weight material, and may emit red, green, blue, or white light.

A second functional layer 222c may be formed on the emission layer 222b. The second functional layer 222c may be a single layer or multiple layers. The second functional layer 222c may include an electron transport layer (ETL) and/or electron injection layer (EIL). The first functional layer 222a and the second functional layer 222c may be integrally formed to commonly correspond to the pixels Pm and Pa (see FIG. 2) included in the first area CA and the display area DA. According to another embodiment, the first functional layer 222a and/or second functional layer 222c may be omitted.

An opposite electrode 223 is arranged on the second functional layer 222c. The opposite electrode 223 may include a conductive material having a low work function. For example, the opposite electrode 223 may include a (semi)transparent layer including Ag, Mg, Al, Pt, Pd, Au, Ni, Nd, Ir, Cr, Li, Ca, or an alloy thereof. Alternatively, the opposite electrode 223 may further include a layer of ITO, IZO, ZnO, or $In_2O_3$ on a (semi)transparent layer containing the aforementioned material. The opposite electrode 223 may be integrally provided on the first area CA and the display area DA.

The pixel electrode 210, the opposite electrode 223, and layers therebetween formed in the display area DA may be included in the organic light-emitting diode OLED.

A capping layer 250 may be formed on the opposite electrode 223. The capping layer 250 may include, for example, lithium fluoride (LiF). Alternatively, the capping layer 250 may include an inorganic insulating material such as silicon nitride, and/or an organic insulating material. According to an embodiment, the capping layer 250 may be omitted.

Meanwhile, the transmission hole TAH corresponding to the transmissive portion TA may be defined in the first functional layer 222a, the second functional layer 222c, the opposite electrode 223, and the capping layer 250. That is, an opening corresponding to the transmissive portion TA may be defined in the first functional layer 222a, the second functional layer 222c, the opposite electrode 223, and the capping layer. According to an embodiment, widths of the openings forming the transmission hole TAH may be substantially the same. For example, a width of an opening of the opposite electrode 223 may be substantially the same as a width of the transmission hole TAH.

The transmission hole TAH corresponding to the transmissive portion TA may mean that the transmission hole TAH overlaps the transmissive portion TA. In this case, the area of the transmission hole TAH may be less than the area of the first hole H1 formed in the inorganic insulating layer IL. To this end, FIG. 6 shows that a width Wt of the transmission hole TAH is less than a width W1 of the first hole H1. Here, the area of the transmission hole TAH and the area of the first hole H1 may be defined as an area of an opening of the least area.

When the transmission hole TAH is provided, a portion of the opposite electrode 223 is removed from the transmissive portion TA, and thus, the light transmittance in the transmissive portion TA may significantly increase. The opposite electrode 223 in the transmissive portion TA may be formed by removing an area corresponding to the transmissive portion TA by laser lift off or may be formed by a fine metal mask (FMM) patterning. Hereinafter, in the present embodiment, it is assumed that the opposite electrode 223 is formed on the first area CA by the FMM mask patterning.

The opposite electrode 223 may be sealed by the organic light-emitting diode OLED and the thin-film encapsulation layer 300. The thin-film encapsulation layer 300 may be arranged on the capping layer 250. The thin-film encapsulation layer 300 may prevent external moisture or foreign substances from penetrating into the organic light-emitting diode OLED.

The thin-film encapsulation layer 300 may include at least one inorganic encapsulation layer and at least one organic encapsulation layer. In this regard, FIG. 6 shows the thin-film encapsulation layer 300 in which the first inorganic encapsulation layer 310, the organic encapsulation layer 320, and the second inorganic encapsulation layer 330 are stacked. According to another embodiment, the number of organic encapsulation layers and inorganic encapsulation layers, and an order in which they are stacked may be changed.

The first inorganic encapsulation layer 310, the organic encapsulation layer 320, and the second inorganic encapsulation layer 330 may be integrally formed to cover the display area DA and the first area CA. Accordingly, the first inorganic encapsulation layer 310, the organic encapsulation layer 320, and the second inorganic encapsulation layer 330 may be inside the transmission hole TAH.

According to another embodiment, the organic encapsulation layer 320 is integrally formed to cover the display area DA and the first area CA, but may not be present in the transmissive portion TA. In other words, the organic encapsulation layer 320 may include an opening corresponding to the transmissive portion TA. In this case, the first inorganic encapsulation layer 310 and the second inorganic encapsulation layer 330 may come into contact with each other inside the transmission hole TAH.

Figure 7:
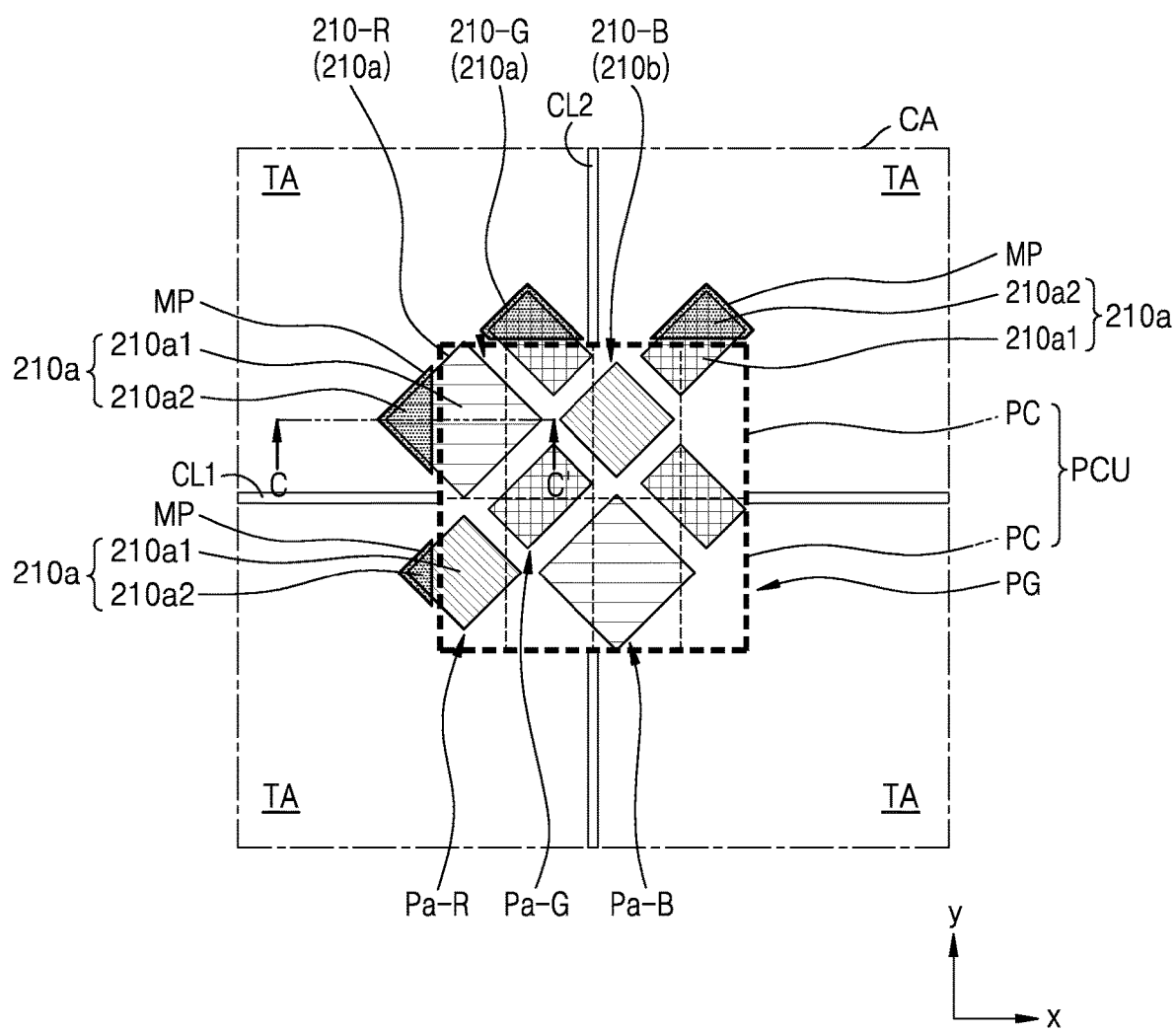
FIG. 7 is a plan view schematically illustrating a portion of the display apparatus according to an embodiment.
Figure 9:
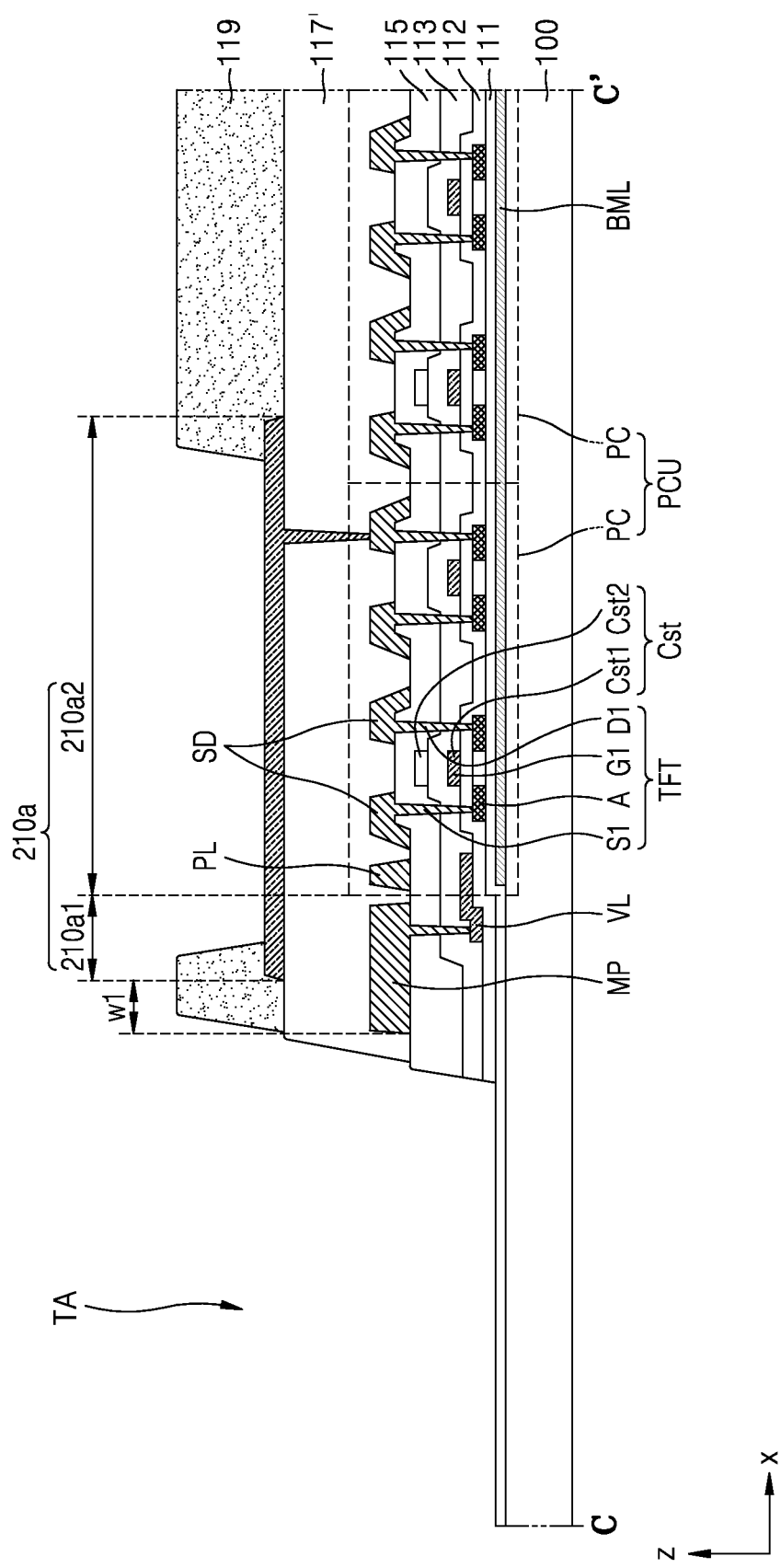

FIG. 7 is a plan view schematically illustrating a portion of a display apparatus according to an embodiment, and FIGS. 8 and 9 are cross-sectional views schematically illustrating a cross-section of the display apparatus taken along line C-C' of FIG. 7.

FIG. 7 shows a portion of the first area CA, in which a pixel group PG and a transmissive portion TA around the pixel group are included. The pixel group PG may be surrounded by a plurality of transmissive portions TA, and may be electrically connected to adjacent pixels through a first line CL1 and a second line CL2 that are arranged along the first direction (x direction) and the second direction (y direction) and may receive signals necessary for driving. In FIG. 7, one first line CL1 and one second line CL2 are shown, but substantially the first line CL1 and the second line CL2 may be plural. The first line CL1 arranged along the first direction (x direction) may be at least one of the aforementioned scan line SL, the previous scan line SL-1, the emission control line EL, the initialization voltage line VL, and the electrode voltage line HL. The second line CL2 arranged along the second direction (y direction) may be at least one of the above-described data line DL and the driving voltage line PL.

Referring to FIG. 7, the pixel group PG includes a plurality of pixels Pa-R, Pa-G, and Pa-B. Each of the plurality of pixels Pa-R, Pa-G, and Pa-B means the auxiliary pixel Pa shown in FIGS. 1, 2, 3, 4, 5, and 6 described above. The plurality of pixels Pa-R, Pa-G, and Pa-B may include a first color emission pixel Pa-R, a second color emission pixel Pa-G, and a third color emission pixel Pa-B. For example, the first color may be red, the second color may be green, and the third color may be blue. According to an embodiment, in a pixel group PG of the same area, the number of second color emission pixel Pa-G may be greater than the number of first color emission pixels Pa-R and the number of third color emission pixels Pa-B.

The plurality of pixels Pa-R, Pa-G, and Pa-B may be arranged in a PenTile structure, a stripe structure, or a matrix structure. According to an embodiment, FIG. 7 shows the plurality of pixels Pa-R, Pa-G, and Pa-B that are arranged in a diamond-shaped PenTile structure.

The pixel group PG may include a pixel circuit unit PCU including a plurality of pixel circuits PC, and a plurality of pixel electrodes 210-R, 210-G, and 210-B each arranged on the pixel circuit unit PCU. Because one pixel electrode is electrically connected to one pixel circuit, the number of pixel electrodes 210-R, 210-G, and 210-B may be the same as the number of pixel circuits PC. The plurality of pixel electrodes 210-R, 210-G, and 210-B may include a red color emission pixel electrode 210-R, a green color emission pixel electrode 210-G, and a blue color emission pixel electrode 210-B.

The pixel group PG includes a first pixel electrode 210a that partially overlaps the pixel circuit unit PCU. Hereinafter, "first pixel electrode 210a" means "a pixel electrode having a first portion 210a1 partially overlapping the pixel circuit unit PCU and a second portion 210a2 not overlapping the pixel circuit unit PCU." In the pixel group PG, the first pixel electrode 210a may be at least one of the plurality of pixel electrodes 210-R, 210-G, and 210-B described above.

In addition, the pixel group PG may further include a second pixel electrode 210b in addition to the first pixel electrode 210a, as shown in FIG. 7. Hereinafter, the "second pixel electrode 210b" shall mean "a pixel electrode that completely overlaps the pixel circuit unit PCU." In the pixel group PG, the "second pixel electrode 210b" may be at least one of the plurality of pixel electrodes 210-R, 210-G, and 210-B described above.

In the present embodiment, a metal pattern layer MP (i.e., a step compensation layer) is arranged below the second portion 210a2 of the first pixel electrode 210a. The metal pattern layer MP will now be described in detail with reference to FIGS. 7 and 8.

Referring to FIG. 8, the pixel circuit unit PCU is formed such that a plurality of conductive layers are stacked with insulating layers therebetween, as shown in FIG. 8. A blocking layer BML may be arranged entirely across spaces between the thin-film transistors TFT of the pixel circuit unit PCU and the substrate 100.

The first portion 210a1 of the first pixel electrode 210a may overlap the pixel circuit unit PCU, and the second portion 210a2 of the first pixel electrode 210a may overlap the metal pattern layer MP.

As a comparative example, when the metal pattern layer MP is not provided, a step occurs in an upper surface of the planarization layer that contacts the first portion overlapping the pixel circuit unit and an upper surface of the planarization layer that contacts the second portion not overlapping the pixel circuit unit. In other words, an upper surface of the planarization layer that overlaps the pixel circuit unit is formed higher than an upper surface of the planarization layer that does not overlap the pixel circuit unit. As described above, when a step occurs in the upper surface of the planarization layer according to whether or not the upper surface of the planarization layer overlaps the pixel circuit unit, a step occurs partially in a pixel electrode arranged on the planarization layer, which reveals a color coordinate defect, that is, a white angle difference (WAD) defect, and thus, the uniformity of emission of pixels is deteriorated.

Accordingly, in the display apparatus 1 according to an embodiment, by providing the metal pattern layer MP overlapping a portion of the first pixel electrode 210a arranged in the first area CA, and compensating for a step of the organic insulating layer 117', it is possible to planarize the upper surface of the organic insulating layer 117' where the first pixel electrode 210a is arranged and improve the uniformity of emission of the pixels.

The metal pattern layer MP may be between the substrate 100 and the first portion 210a1 of the first pixel electrode 210a. Therefore, the metal pattern layer MP may contain the same material as at least one of the metal layers located between the substrate 100 and the first pixel electrode 210a. According to an embodiment, FIG. 8 shows that the metal pattern layer MP contains the same material as an electrode layer SD corresponding to the source electrode S1 or drain electrode D1 of the thin-film transistor TFT.

According to another embodiment, the metal pattern layer MP may contain the same material as at least one of the gate electrode G1, the second electrode Cst2, and the electrode layer SD. However, considering that the electrode layer SD is formed thicker than the gate electrode G1 and the second electrode Cst2, and that the electrode layer SD is arranged directly below the organic insulating layer 117' where the first pixel electrode 210a is arranged, providing the metal pattern layer MP on the same layer as the electrode layer SD may be more advantageous in planarizing the upper surface of the organic insulating layer 117'. For example, the gate electrode G1 and the second electrode Cst2 may each have a thickness of about 2000 Å to 2500 Å, and the electrode layer SD may have a thickness of about 5000 Å to 7000 Å.

One end MPe1 at one side of the metal pattern layer MP may be extended by a first width w1 compared to one end 210a1 of the first pixel electrode 210a. When an end MPe of the metal pattern layer MP is formed to extend beyond the end 210a1 of the first pixel electrode 210a, an upper surface of the organic insulating layer 117' may be stably planarized. However, the present disclosure is not limited thereto, and according to another embodiment, the end MPe1 at one side of the metal pattern layer MP may correspond to the end 210a1 of the first pixel electrode 210a.

In addition, the other end MPe2 at the opposite side of the metal pattern layer MP may be spaced apart from the pixel circuit unit PCU by a preset interval. Therefore, neither the metal pattern layer MP nor the pixel circuit unit PCU may be arranged in the interval. However, the interval is very narrow and does not affect the planarization of the upper surface of the organic insulating layer 117'.

Meanwhile, the metal pattern layer MP may be provided in various shapes. For example, the metal pattern layer MP may be polygonal, circular, elliptical, or various shapes corresponding to some of these shapes. In FIG. 7, the metal pattern layer MP is provided in a substantially triangular shape corresponding to a shape of the other end 210a2 of the first pixel electrode 210a, but the present disclosure is not limited thereto.

According to an embodiment, the metal pattern layer MP may be provided as a floating electrode. The metal pattern layer MP may have an island shape that is not electrically connected to any line or electrode. In this case, the metal pattern layer MP may simply serve to compensate for a step on the upper surface of the organic insulating layer 117' without electrical function.

According to another embodiment, a constant voltage may be applied to the metal pattern layer MP. The constant voltage applied to the metal pattern layer MP may be, for example, the first power voltage ELVDD or initialization voltage $V_{int}$. The metal pattern layer MP in FIG. 8 may be electrically connected to the driving voltage line PL that is arranged on the same layer as the metal pattern layer MP. In this case, a constant voltage equal to the first power voltage ELVDD may be applied to the metal pattern layer MP. In addition, as shown in FIG. 9, the metal pattern layer MP may be electrically connected to the initialization voltage line VL. In this case, a constant voltage equal to the initialization voltage $V_{int}$ may be applied to the metal pattern layer MP.

As described above, the metal pattern layer MP may be provided as a floating electrode or may be electrically connected to another line or electrode. However, when the metal pattern layer MP is provided as a floating electrode, the metal pattern layer MP may be charged with a positive voltage, negative voltage, or ground voltage depending on the surrounding circuit and the electrical properties may fluctuate, and may thus interfere with the stabilization of the first pixel electrode 210a and the surrounding circuit. Therefore, applying a constant voltage to the metal pattern layer MP may be more advantageous in terms of pixel stability.

Figure 10:
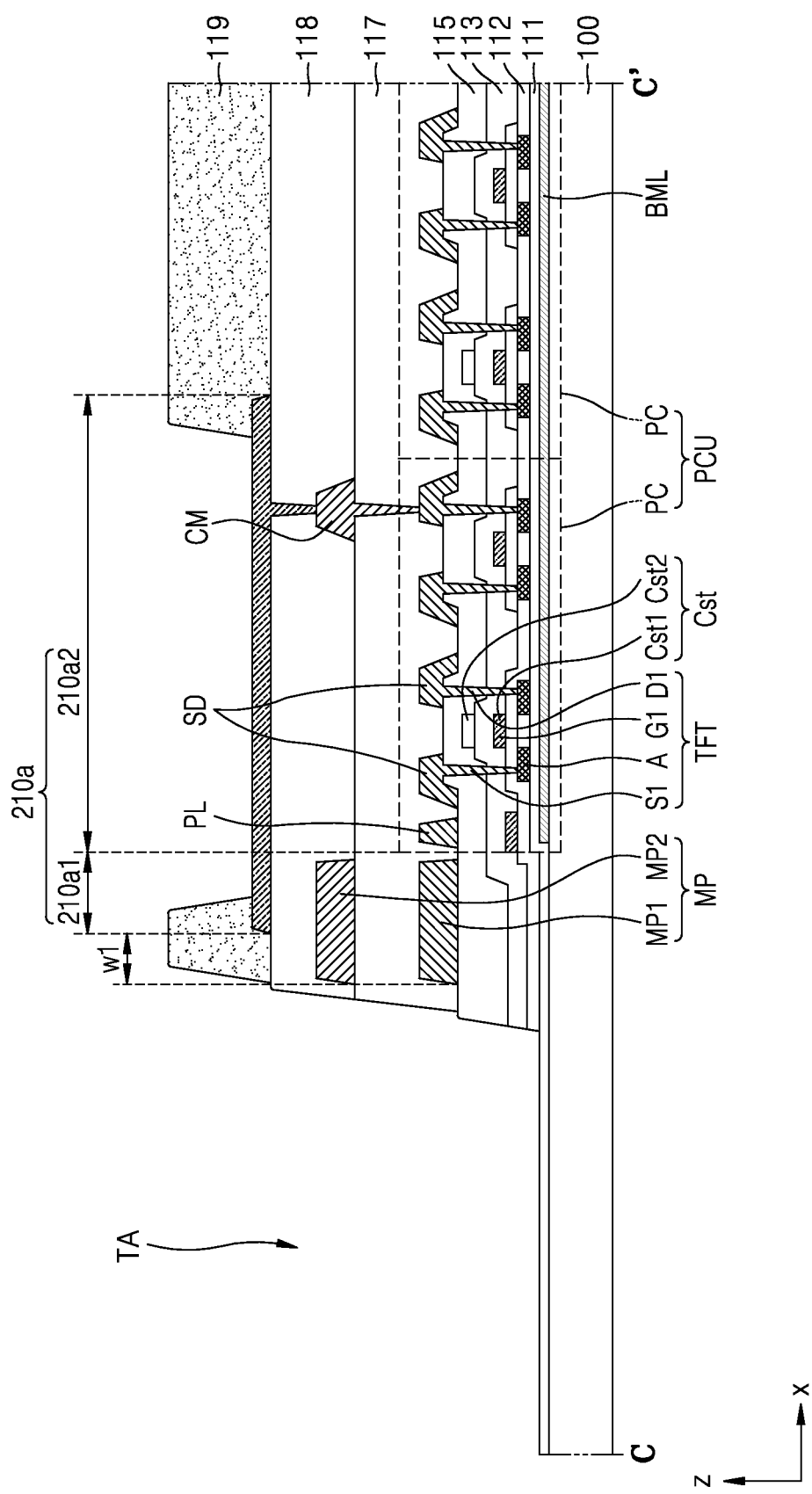
FIG. 10 is a cross-sectional view schematically illustrating a portion of a display apparatus according to an embodiment.

FIG. 10 is a cross-sectional view schematically illustrating a portion of the display apparatus according to an embodiment.

The embodiment of FIG. 10 differs in structure of the metal pattern layer MP from the embodiment of FIG. 8 described above. The remaining structure except for the structure of the metal pattern layer MP is the same as the structure of the embodiment of FIG. 8 described above, and the differences will now be described below with a focus on the differences.

Referring to FIG. 10, the metal pattern layer MP may be provided in a multi-layer structure. According to an embodiment, the metal pattern layer MP may include a first metal layer MP1 and a second metal layer MP2 arranged on different layers. The first metal layer MP1 and the second metal layer MP2 may be arranged to correspond to the first portion 210a1 of the first pixel electrode 210a, wherein the first metal layer MP1 and the second metal layer MP2 overlap each other.

According to an embodiment, the first metal layer MP1 contains the same material as the electrode layer SD of the thin-film transistor TFT, and the second metal layer MP2 may contain the same material as the contact metal layer CM that connects the electrode layer SD to the first pixel electrode 210a. The cross-section shown in FIG. 10 may be the same as the cross-section shown in FIG. 6. Therefore, the first metal layer MP1 may be arranged on the interlayer insulating layer 115, and the second metal layer MP2 may be arranged on the first organic insulating layer 117. The second organic insulating layer 118 may be arranged on the second metal layer MP2.

Although FIG. 10 shows that the first metal layer MP1 and the second metal layer MP2 are electrically separated from each other, according to another embodiment, the first metal layer MP1 may be electrically connected to the second metal layer MP2 via a contact hole (not shown) that penetrates the first organic insulating layer 117. In this case, a constant voltage may be applied to the first metal layer MP1 or second metal layer MP2 as described above.

Although FIG. 10 shows that the metal pattern layer MP includes the first metal layer MP1 and the second metal layer MP2, the metal pattern layer MP may further include a third metal layer (not shown) or the like, below the first metal layer MP1. In this case, the third metal layer may contain the same material as a gate electrode G1 and/or second electrode Cst2 of the thin-film transistor TFT.

Figure 11:
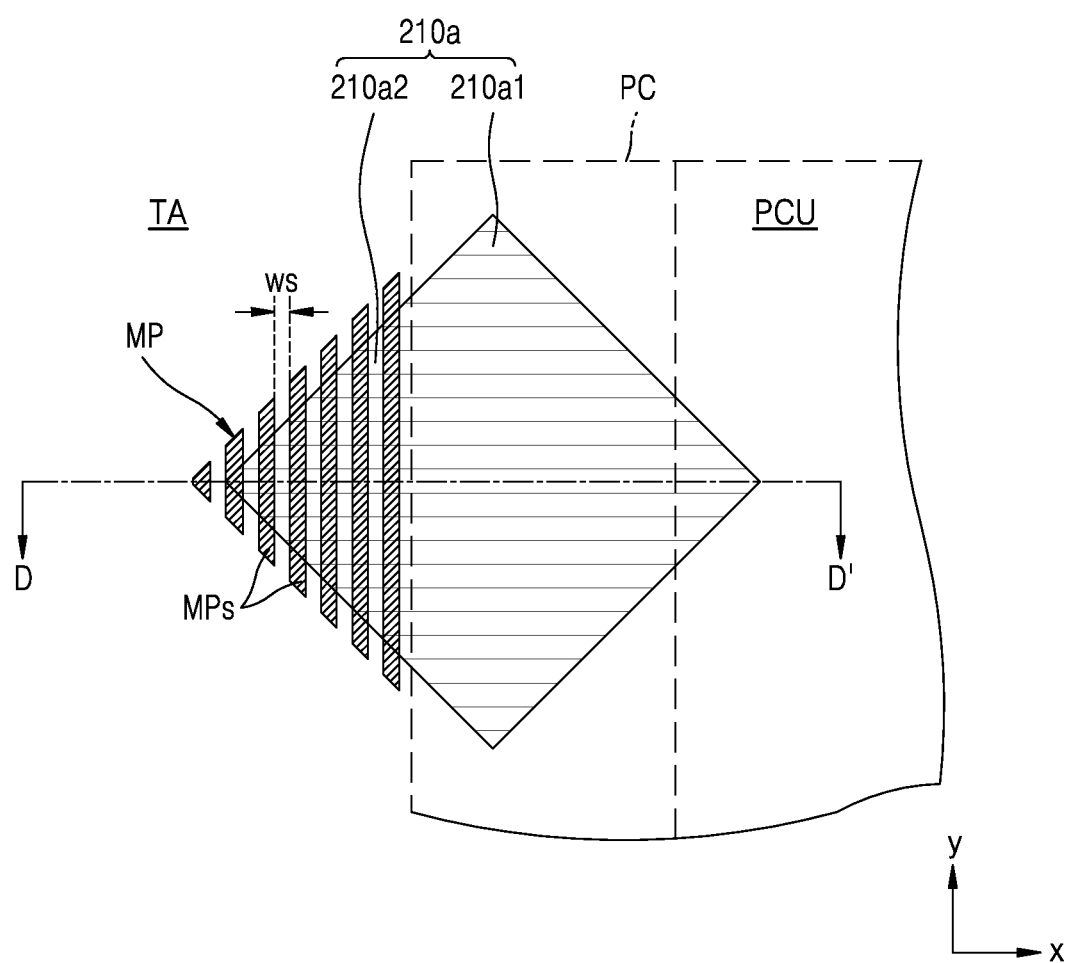
FIGS. 11 and 12 are plan views schematically illustrating a portion of a display apparatus according to an embodiment.
Figure 12:
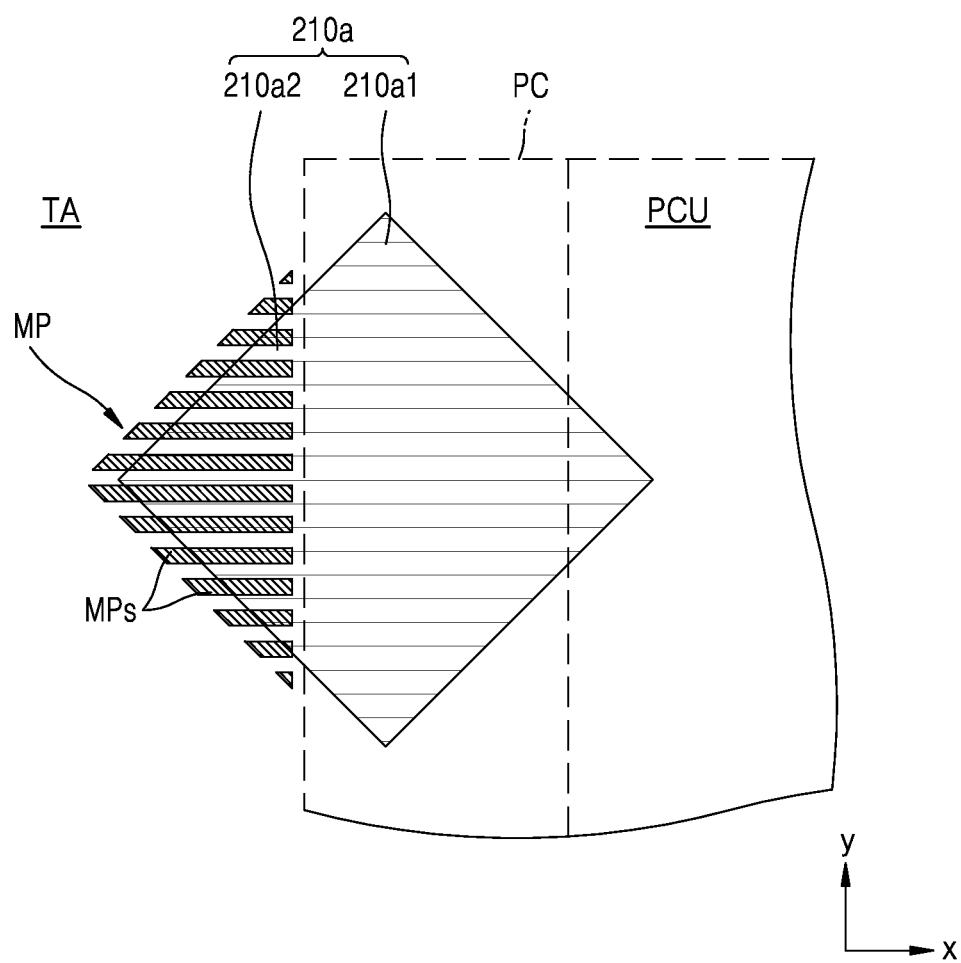
Figure 13:
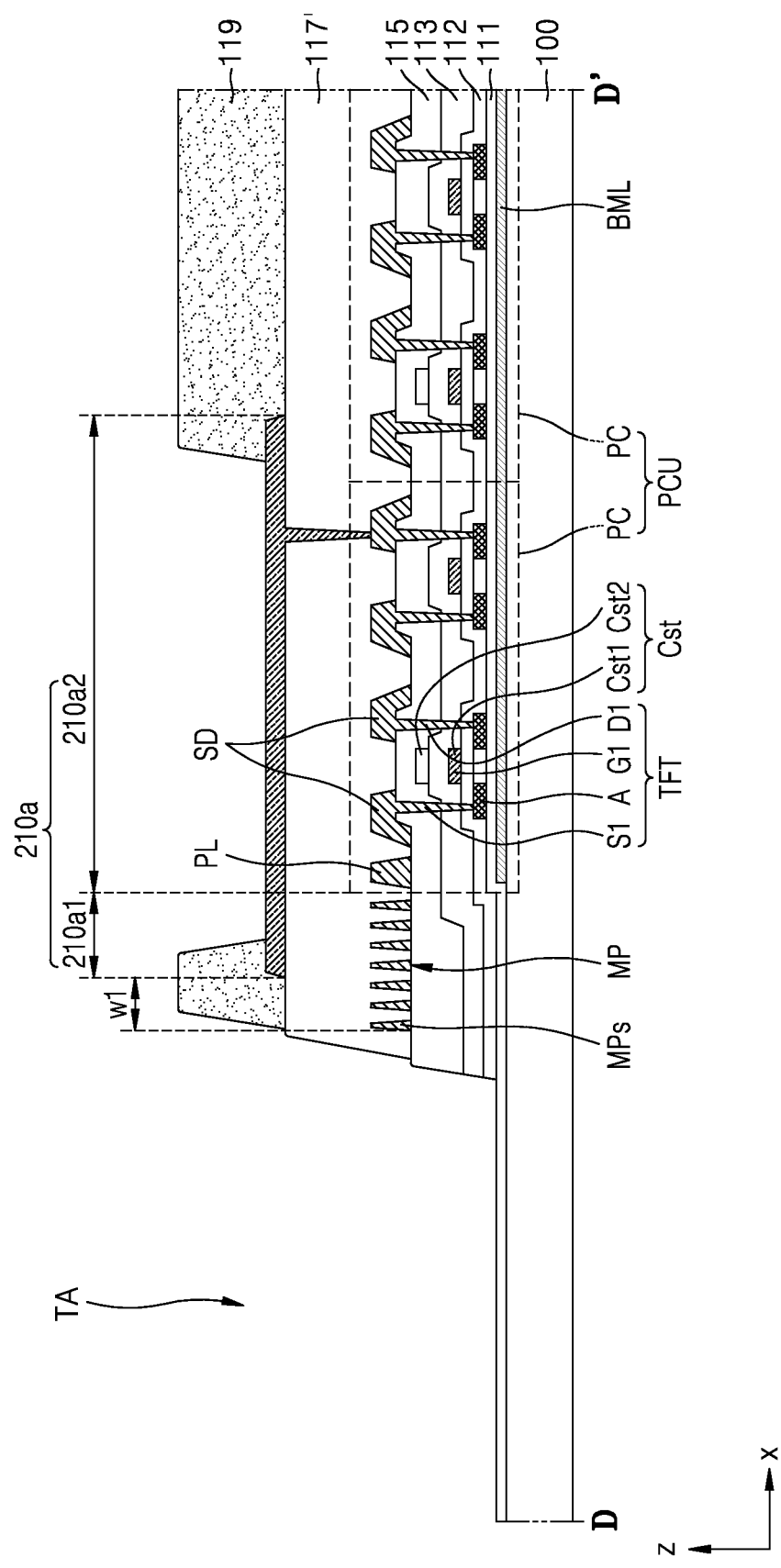
FIG. 13 is a cross-sectional view schematically illustrating a portion of the display apparatus of FIG. 11 taken along line D-D' of FIG. 11 according to an embodiment.
Figure 14:
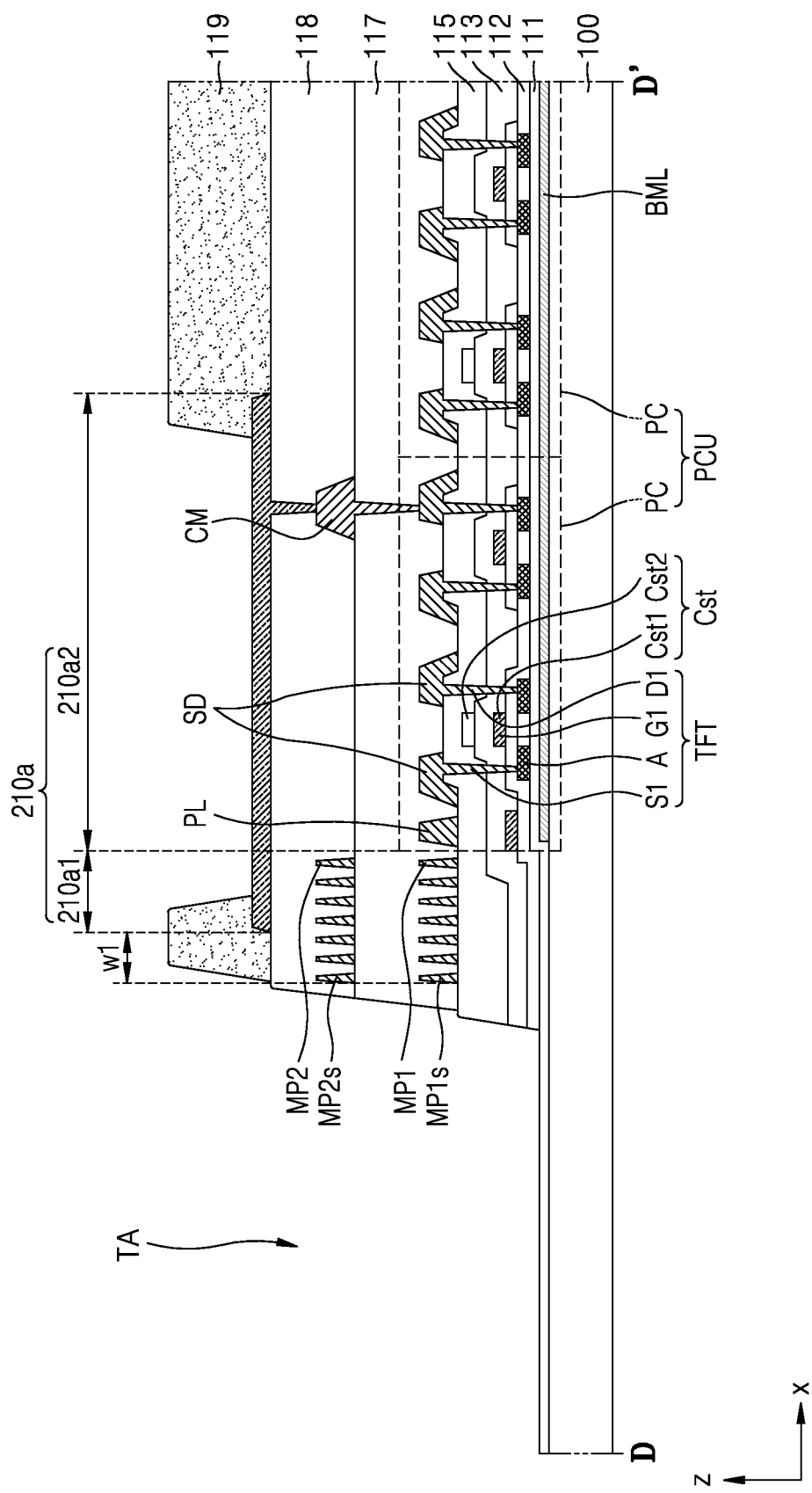
FIG. 14 a cross-sectional view schematically illustrating a portion of the display apparatus of FIG. 11 taken along line D-D' of FIG. 11 according to another embodiment.

FIGS. 11 and 12 are plan views schematically illustrating a portion of the display apparatus according to an embodiment, FIG. 13 is a cross-sectional view schematically illustrating a cross-section of the display apparatus taken along line D-D' of FIG. 11 according to an embodiment, and FIG. 14 is a cross-sectional view schematically illustrating a portion of the display apparatus of FIG. 11 taken along line D-D' of FIG. 11 according to another embodiment.

Referring to FIGS. 11 and 13, the metal pattern layer MP arranged to correspond to the second portion 210a2 of the first pixel electrode 210a may include a plurality of slit patterns MPs. The plurality of slit patterns MPs extend along one direction, and may be spaced apart by a certain width ws. In FIG. 11, the plurality of slit patterns MPs are arranged along the second direction (y direction). According to another embodiment, the plurality of slit patterns MPs may be arranged along the first direction (x direction), as shown in FIG. 12. Although not shown, a direction in which the plurality of slit patterns MPs are arranged is not limited to a specific direction, and the slit pattern MPs may also be arranged in a third direction that is a diagonal direction crossing the first direction (x direction) and the second direction (y direction).

When the metal pattern layer MP includes the plurality of slit patterns MPs as shown in FIG. 11 or 12, it is possible to prevent static electricity than when the metal pattern layer MP is formed in one pattern as in the above-described embodiments.

According to another embodiment, similar to FIG. 10 described above, when the metal pattern layer MP of FIG. 15 is provided as a multi-layer, the first metal layer MP1 may include a plurality of first slit patterns MP1s, and the second metal layer MP2 may include a plurality of second slit patterns MP2s. Although FIG. 10 shows that the plurality of first slit patterns MP1s and the plurality of second slit patterns MP2s are arranged along the same direction, the plurality of first slit patterns MP1s may be arranged along the first direction (x direction), and the plurality of second slit patterns MP2s may be arranged along the second direction (y direction).

Figure 15:
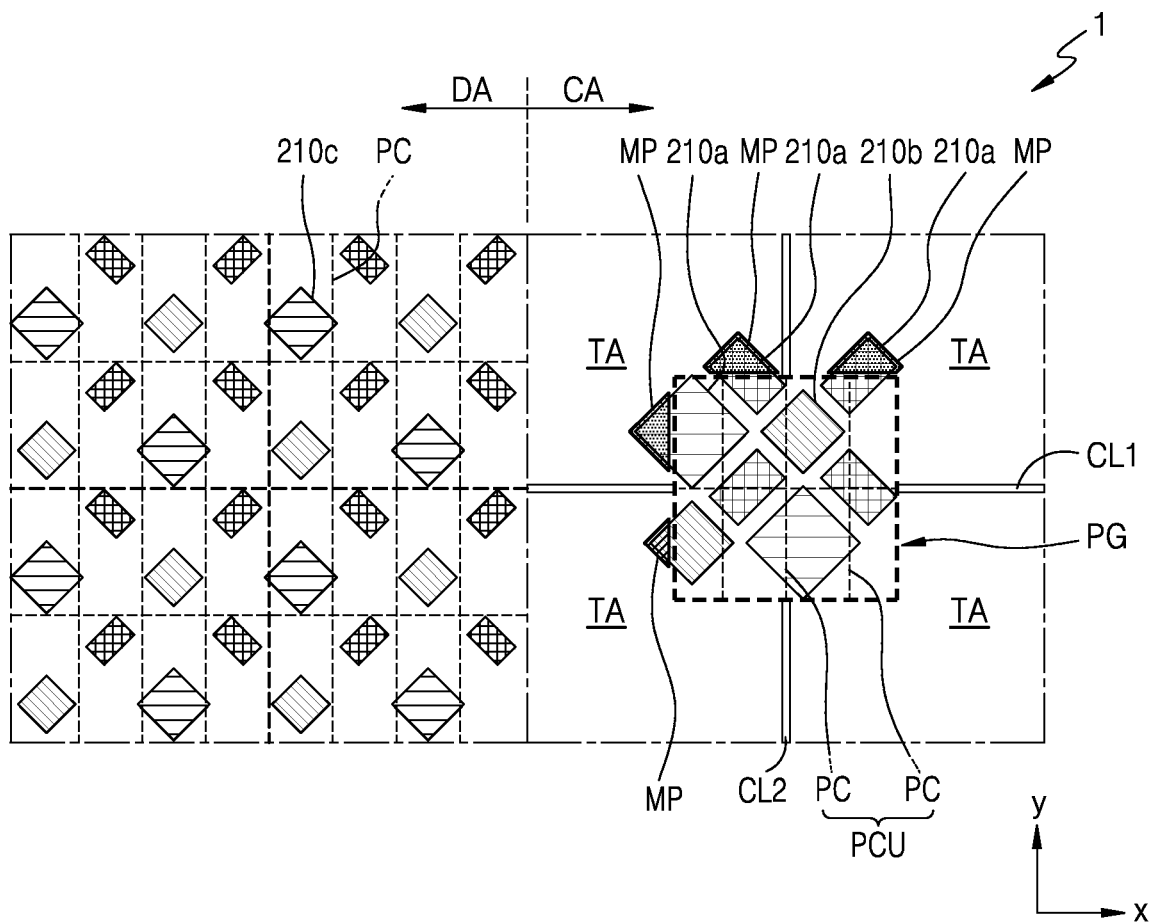
FIG. 15 is a plan view schematically illustrating a portion of a display apparatus according to an embodiment.

FIG. 15 is a plan view schematically illustrating a portion of the display apparatus according to an embodiment.

Referring to FIG. 15, the pixel group PG is arranged in the first area CA, and the transmissive portion TA is arranged around the pixel group PG. The pixel group PG may include the pixel circuit unit PCU, the first pixel electrode 210a partially overlapping the pixel circuit unit PCU, and the second pixel electrode 210b completely overlapping the pixel circuit unit PCU.

The third pixel electrode 210c may be arranged in the display area DA that surrounds at least a portion of the first area CA. Similar to the structure of the pixel group PG described above, the pixel circuit PC may be arranged below the third pixel electrode 210c, and the third pixel electrode 210c may be electrically connected to the pixel circuit PC.

According to an embodiment, the areas of the first pixel electrode 210a and the second pixel electrode 210b arranged in the first area CA may be greater than the area of the third pixel electrode 210c arranged in the display area DA. In this case, it is assumed that a first pixel P1 (not shown) including the first pixel electrode 210a, a second pixel P2 (not shown) including the second pixel electrode 210b, and a third pixel P3 (not shown) including the third pixel electrode 210c all emit the same color of light. That is, a first emission layer, a second emission layer, and a third emission layer respectively arranged on the first pixel electrode 210a, the second pixel electrode 210b, and the third pixel electrode 210c may emit the same color of light.

Because the transmissive portion TA exists in the first area CA, the first area CA has a lower resolution than the display area DA. Therefore, per the same area, the first area CA has lower luminance than the display area DA. In order to compensate for this luminance difference, the display apparatus 1 according to one or more embodiments may be provided such that the area of the first pixel electrode 210a and the second pixel electrode 210b arranged in the first area CA is greater than the area of the third pixel electrode 210c arranged in the display area DA.

By providing the area of the first pixel electrode 210a in the first area CA which is larger than that of the third pixel electrode 210c in the display area DA as described above, a portion of the first pixel electrode 210a does not overlap the pixel circuit unit PCU. The metal pattern layer MP is arranged below the second portion 210a2 (not shown) of the first pixel electrode 210a that does not overlap the pixel circuit unit PCU, as described above. The metal pattern layer MP is arranged below the first portion 210a2 (not shown) of the first pixel electrode 210a not overlapping the pixel circuit unit PCU, thus compensating for a step of the second organic insulating layer 118 where the first pixel electrode 210a is arranged, and thereby the upper surface of the second organic insulating layer is planarized. Thus, the uniformity of emission of the first pixel P1 (not shown) including the first pixel electrode 210a may be effectively improved.

According to one or more embodiments, it is possible to implement a display apparatus in which a display area is expanded so that an image may be displayed even in an area where components are arranged. However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate including a first area in which a transmissive portion is located and a second area adjacent to the first area;
    a pixel circuit unit arranged in the first area and including a pixel circuit;
    a first pixel electrode arranged in the first area and electrically connected to the pixel circuit, the first pixel electrode having a first portion overlapping the pixel circuit unit and a second portion not overlapping the pixel circuit unit; and
    a metal pattern layer disposed between the substrate and the first pixel electrode and corresponding to the second portion of the first pixel electrode,
    wherein one end of the metal pattern layer is extended by a width compared to one end of the first pixel electrode.

2. The display apparatus of claim 1, wherein a constant voltage or a signal is applied to the metal pattern layer.

3. The display apparatus of claim 1, wherein a voltage is not applied to the metal pattern layer.

4. The display apparatus of claim 1, wherein the metal pattern layer includes a plurality of slit patterns along a first direction.

5. The display apparatus of claim 1, wherein the pixel circuit includes a thin-film transistor and a storage capacitor,
    the thin-film transistor includes a semiconductor layer, a gate electrode at least partially overlapping the semiconductor layer, and an electrode layer connected to the semiconductor layer,
    the storage capacitor includes a first electrode, which is a portion of the gate electrode, and a second electrode overlapping the first electrode, and
    the metal pattern layer includes a same material as at least one of the gate electrode, the electrode layer, and the second electrode.

6. The display apparatus of claim 5, wherein the metal pattern layer includes a first metal layer having a same material as the electrode layer.

7. The display apparatus of claim 6, further comprising a contact metal layer disposed between the electrode layer and the first pixel electrode, wherein the metal pattern layer is arranged on the first metal layer and overlaps the first metal layer, and further includes second metal layer having a same material as the contact metal layer.

8. The display apparatus of claim 7, wherein the first metal layer includes a plurality of first slit patterns, and the second metal layer includes a plurality of second slit patterns.

9. The display apparatus of claim 1, further comprising a second pixel electrode arranged adjacent to the first pixel electrode on the first area, wherein the second pixel electrode entirely overlaps the pixel circuit unit.

10. The display apparatus of claim 1, further comprising:

a third pixel electrode on the second area;

a third emission layer on the third pixel electrode; and a first emission layer on the first pixel electrode, wherein the first emission layer and the third emission layer emit a same color of light, and an area of the first pixel electrode is greater than an area of the third pixel electrode.

11. The display apparatus of claim 1, further comprising an organic insulating layer covering the pixel circuit unit, wherein the first pixel electrode is disposed on an upper surface of the organic insulating layer, wherein the upper surface of the organic insulating layer on which the first portion and the second portion of the first pixel electrode are disposed is planarized.

12. The display apparatus of claim 11, wherein an opening corresponding to the transmissive portion is defined in the organic insulating layer.

13. The display apparatus of claim 1, wherein a resolution of the first area is lower than a resolution of the second area.

14. The display apparatus of claim 1, further comprising a component disposed on one side of the substrate and corresponding to the first area.

15. The display apparatus of claim 14, wherein the component includes an imaging device.

* * * * *